(12) United States Patent
Kato et al.

(10) Patent No.: US 7,825,447 B2
(45) Date of Patent: Nov. 2, 2010

(54) MOS CAPACITOR AND SEMICONDUCTOR DEVICE

(75) Inventors: Kiyoshi Kato, Atsugi (JP); Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 132 days.

(21) Appl. No.: 11/547,904

(22) PCT Filed: Apr. 21, 2005

(86) PCT No.: PCT/JP2005/008087

§ 371 (c)(1),
(2), (4) Date: Oct. 10, 2006

(87) PCT Pub. No.: WO2005/106961

PCT Pub. Date: Nov. 10, 2005

(65) Prior Publication Data

US 2007/0210364 A1    Sep. 13, 2007

(30) Foreign Application Priority Data

Apr. 28, 2004    (JP)    ............................. 2004-132813

(51) Int. Cl.
*H01L 29/94* (2006.01)
(52) U.S. Cl. ............................. 257/296; 257/E29.345
(58) Field of Classification Search ............. None
See application file for complete search history.

(56) References Cited

U.S. PATENT DOCUMENTS

| | | | |
|---|---|---|---|
| 5,501,989 A | 3/1996 | Takayama et al. | |
| 5,962,872 A | 10/1999 | Zhang et al. | |
| 6,495,858 B1 * | 12/2002 | Zhang | ........................... 257/59 |
| 6,545,318 B1 * | 4/2003 | Kunikiyo | ..................... 257/349 |

(Continued)

FOREIGN PATENT DOCUMENTS

JP    02-137255    5/1990

(Continued)

OTHER PUBLICATIONS

International Search Report (Application No. PCT/JP2005/008087) Dated Aug. 23, 2005.

(Continued)

*Primary Examiner*—Benjamin P Sandvik
(74) *Attorney, Agent, or Firm*—Eric J. Robinson; Robinson Intellectual Property Law Office, P.C.

(57) ABSTRACT

A capacitor capable of functioning as a capacitor even when an AC voltage is applied thereto is provided without increasing the manufacturing steps of a semiconductor device. A transistor is used as a MOS capacitor where a pair of impurity regions formed on opposite sides of a channel formation region are each doped with impurities of different conductivity so as to be used as a source region or a drain region. Specifically, assuming that an impurity region that is doped with N-type impurities is referred to as an N-type region while an impurity region that is doped with P-type impurities is referred to as a P-type region, a transistor is provided where a channel formation region is interposed between the N-type region and the P-type region, which is used as a MOS capacitor.

11 Claims, 16 Drawing Sheets

U.S. PATENT DOCUMENTS

| | | |
|---|---|---|
| 6,867,431 B2 | 3/2005 | Konuma et al. |
| 2002/0089049 A1* | 7/2002 | Leduc et al. ................ 257/679 |
| 2003/0218213 A1* | 11/2003 | Ipposhi et al. .............. 257/350 |
| 2004/0021166 A1* | 2/2004 | Hyde et al. ................. 257/314 |
| 2004/0089890 A1* | 5/2004 | Burnett ...................... 257/296 |
| 2006/0022246 A1 | 2/2006 | Honda |

FOREIGN PATENT DOCUMENTS

| | | |
|---|---|---|
| JP | 07-045789 | 2/1995 |
| JP | 08-213627 | 8/1996 |
| JP | 2002-057350 | 2/2002 |

OTHER PUBLICATIONS

Written Opinion (Application No. PCT/JP2005/008087) Dated Aug. 23, 2005.

* cited by examiner $Vg-Vs > Vthn$ $Vg-Vs < Vthp$ 558 559   540   541   542

558 559

1201

1214  1211  1212  1213  1210

MOS CAPACITOR AND SEMICONDUCTOR DEVICE

TECHNICAL FIELD

The present invention relates to a capacitor using a transistor, and a semiconductor device using such a capacitor.

BACKGROUND ART

A capacitor is one of the essential passive elements for manufacture of a semiconductor integrated circuit (hereinafter abbreviated to an integrated circuit), particularly an analog circuit. Specifically, it is used as a storage capacitor in a pixel of a liquid crystal display device as well as an analog circuit such as a power supply circuit and a DRAM. Increase in the area of a capacitor leads to a higher cost of an integrated circuit, therefore, it is preferable that the capacitor occupy a small area but have a large capacitance value.

A gate insulating film of a transistor is advantageous in that it is thin and has a uniform thickness as compared to other insulating films used in an integrated circuit, has few defects or impurities, and has a high withstand voltage against dielectric breakdown in spite of its thickness. Therefore, the gate insulating film is suitable for a dielectric of a capacitor. In the case of an integrated circuit having both a transistor and a capacitor, MOS capacitance (gate capacitance) formed between an active layer and a gate electrode of the transistor is often used as the capacitor. A capacitor using MOS capacitance (hereinafter referred to as a MOS capacitor) can use as its dielectric a gate insulating film having the superior properties as set forth above, and it can be formed simultaneously with a transistor without increasing the number of the manufacturing steps.

The following Patent Document 1 discloses a structure of a conventional MOS capacitor.

[Patent Document 1]

Japanese Patent Laid-Open No. Hei 7-45789.

DISCLOSURE OF INVENTION

A MOS capacitor, however, functions as a capacitor only after a channel is formed in its active layer. Therefore, in order to use a transistor as a MOS capacitor, a voltage between a gate electrode and a source region (gate voltage) is required to be controlled in accordance with the conductivity of the transistor. Specifically, when the transistor is an N-channel transistor, it is required to have a gate voltage higher than the threshold voltage, and when the transistor is a P-channel transistor, on the other hand, it is required to have a gate voltage lower than the threshold voltage.

Accordingly, the aforementioned MOS capacitor has conductivity and there may be a case where it does not function as a capacitor when a potential of a source region or a drain region and a potential of a gate electrode are inverted from each other since a channel cannot be formed. For example, when a MOS capacitor is used in an RF resonant circuit, an AC voltage is applied between a gate electrode and a source region or a drain region. Accordingly, a potential of the gate electrode and a potential of the source region or the drain region are inverted from each other at regular intervals, thus it is difficult for the MOS capacitor to stably function as a capacitor. Also, in the case of a storage capacitor used in a pixel of a liquid crystal display device, an AC voltage is applied to the storage capacitor depending on a driving method, in which case it is difficult for the MOS capacitor to function as a storage capacitor.

Thus, a capacitor to which an AC voltage is applied has to be a non-conductive capacitor capable of functioning as a capacitor regardless of the potential levels (plus/minus) of the two electrodes. Note that the non-conductive capacitor in this specification means a capacitor capable of functioning regardless of the potential levels (plus/minus) of the two electrodes. However, an insulating film other than a gate insulating film used in an integrated circuit is generally thick. Therefore, when a capacitor is formed by using such an insulating film as its dielectric, a capacitance value per area is decreased, which makes it difficult to reduce an area of the capacitor in the integrated circuit. Further, when an insulating film as thin as a gate insulating film is formed separately to be used as a dielectric only for increasing the capacitance value of the capacitor per area, the number of the manufacturing steps of the integrated circuit is disadvantageously increased.

In view of the foregoing, the present invention provides a capacitor capable of functioning as a capacitor even when an AC voltage is applied thereto without increasing the manufacturing steps of a semiconductor device.

The present invention provides a transistor used as a MOS capacitor where a pair of impurity regions each doped with impurities of different conductivity, specifically N-type impurities and P-type impurities, which are formed on opposite sides of a channel formation region are used as a source region or a drain region. Specifically, assuming that the impurity region doped with N-type impurities is referred to as an N-type region while an impurity region doped with P-type impurities is referred to as a P-type region, the present invention provides a transistor having a channel formation region interposed between the N-type region and the P-type region, which is used as a MOS capacitor.

In the case of a MOS capacitor having the aforementioned structure, an N channel is formed in the channel formation region by free electrons from the N-type region when the gate voltage becomes higher than the threshold voltage. When the gate voltage becomes lower than the threshold voltage, on the other hand, a P channel is formed in the channel formation region by free holes from the P-type region. Accordingly, a channel can be formed in a MOS capacitor having the aforementioned structure in either case, thus it can function as a non-conductive capacitor regardless of the potential levels (plus/minus) of the source region or the drain region and the gate electrode.

The transistor used as the aforementioned MOS capacitor may be either a transistor formed by using a semiconductor substrate or a transistor formed by using an SOI substrate. Alternatively, it may be a transistor formed by using a thin semiconductor film that is formed over a substrate having an insulating surface such as a glass substrate, a quartz substrate and a plastic substrate.

The semiconductor device of the present invention includes an integrated circuit using the aforementioned MOS capacitor, and a semiconductor display device using the aforementioned MOS capacitor. The integrated circuit includes various integrated circuits that can use a capacitor such as a micro processor and an image processing circuit. The semiconductor display device includes a liquid crystal display device, a light emitting device comprising pixels each including a light emitting element represented by an organic light emitting element (OLED), a DMD (Digital Micromirror Device), a PDP (Plasma Display Panel), an FED (Field Emission Display) and other display devices of which driver circuit comprises circuit elements formed of a semiconductor film. In the case of the semiconductor display device, a MOS capacitor may be used either in a pixel or a driver circuit.

A MOS capacitor having the aforementioned structure can be formed simultaneously with an N-channel transistor and a P-channel transistor without increasing the manufacturing steps. Since the MOS capacitor functions as a non-conductive capacitor, it can be applied to various objects such as an analog circuit and a semiconductor display device using an AC voltage.

Further, a MOS capacitor having the aforementioned structure can use a gate insulating film as a dielectric of the capacitor. A gate insulating film is thin and has a uniform thickness as compared to other insulating films used in an integrated circuit. Therefore, when the gate insulating film is used as a dielectric, a capacitance value per area of the capacitor can be increased, and an area of the capacitor in an integrated circuit can be reduced.

In addition, since a gate insulating film has few defects or impurities and has a uniform thickness, it has an advantageous property of a high withstand voltage against dielectric breakdown regardless of its thickness. Accordingly, a MOS capacitor with high withstand voltage can be formed.

In addition, according to the semiconductor device of the present invention, a MOS capacitor having a high capacitance value per area can be formed while suppressing the number of the manufacturing steps, therefore, cost reduction can be achieved. Further, since the MOS capacitor is a non-conductive capacitor, high design flexibility of a semiconductor device can be ensured.

BEST MODE FOR CARRYING OUT THE INVENTION

Although the present invention will be fully described by way of Embodiments with reference to the accompanying drawings, it is to be understood that various changes and modifications will be apparent to those skilled in the art. Therefore, unless otherwise such changes and modifications depart from the scope of the present invention, they should be construed as being included therein.

Figure 1A:
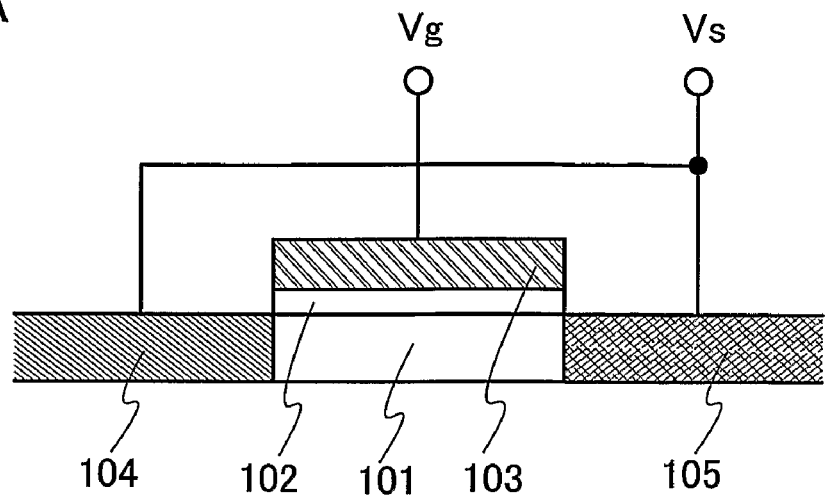
FIGS. 1A to 1C are schematic diagrams each illustrating a cross section of the MOS capacitor of the present invention.

Description is made below with reference to FIGS. 1A to 1C on the structure of the MOS capacitor of the present invention. FIG. 1A is a schematic diagram illustrating a cross section of the MOS capacitor of the present invention. Reference numeral 101 denotes a channel formation region, 102 denotes a gate insulating film and 103 denotes an electrode (gate electrode). The channel formation region 101 overlaps the gate electrode 103 with the insulating film (gate insulating film) 102 interposed therebetween.

Reference numeral 104 denotes an N-type region (first impurity region), and 105 denotes a P-type region (second impurity region). The N-type region 104 is a region where N-type impurities are doped into a semiconductor to have N-type conductivity. Meanwhile, the P-type impurity region 105 is a region where P-type impurities are doped into a semiconductor to have P-type conductivity. The channel formation region 101 is interposed between the N-type region 104 and the P-type region 105, and the N-type region 104 and the P-type region 105 function as a source region or a drain region.

Charges can be accumulated in the MOS capacitor by a gate voltage that corresponds to the difference between the voltage Vg of the gate electrode 103 and the voltage Vs of the N-type region 104 or the P-type region 105.

Figure 1B:
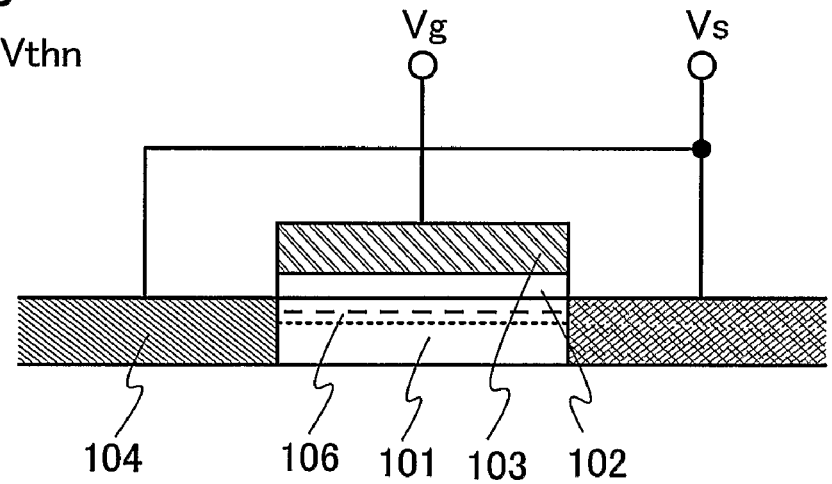

FIG. 1B illustrates a state where charges are accumulated in the MOS capacitor in FIG. 1A by forming an N channel in the channel formation region 101. Assuming that the threshold voltage for forming an N channel is Vthn, an N channel 106 can be formed in the channel formation region 101 of the closer area to the gate insulating film 102 when Vg−Vs>Vthn is satisfied. In the N channel 106, free electrons (−) generated in the channel formation region 101 and free electrons (−) from the N-type region 104 are accumulated, therefore, the N channel 106 has N-type conductivity.

Accordingly, charges can be accumulated between the gate electrode 103 and the N channel 106 or the N-type region 104.

Figure 1C:
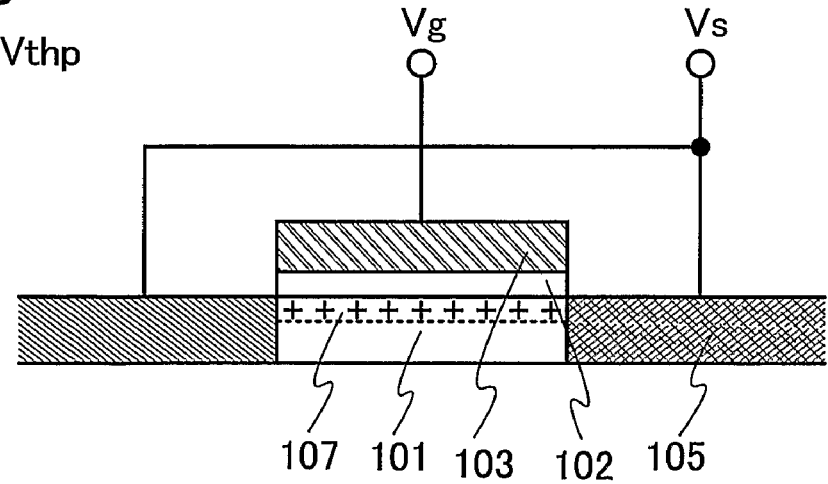

FIG. 1C illustrates a state where charges are accumulated in the MOS capacitor in FIG. 1A by forming a P channel in the channel formation region 101. Assuming that the threshold voltage for forming a P channel is Vthp, a P channel 107 can be formed in the channel formation region 101 of the closer area to the gate insulating film 102 when Vg−Vs<Vthp is satisfied. In the P channel 107, free holes (+) generated in the channel formation region 101 and free holes (+) from the P-type region 105 are accumulated, therefore, the P channel 107 has P-type conductivity.

Accordingly, charges can be accumulated between the gate electrode 103 and the P channel 107 or the P-type region 105.

As shown in FIGS. 1B and 1C, charges can be accumulated in the MOS capacitor in either case where the voltage Vg of the gate electrode 103, and the voltage Vs of the N-type region 104 or the P-type region 105 are inverted from each other.

Figure 2A:
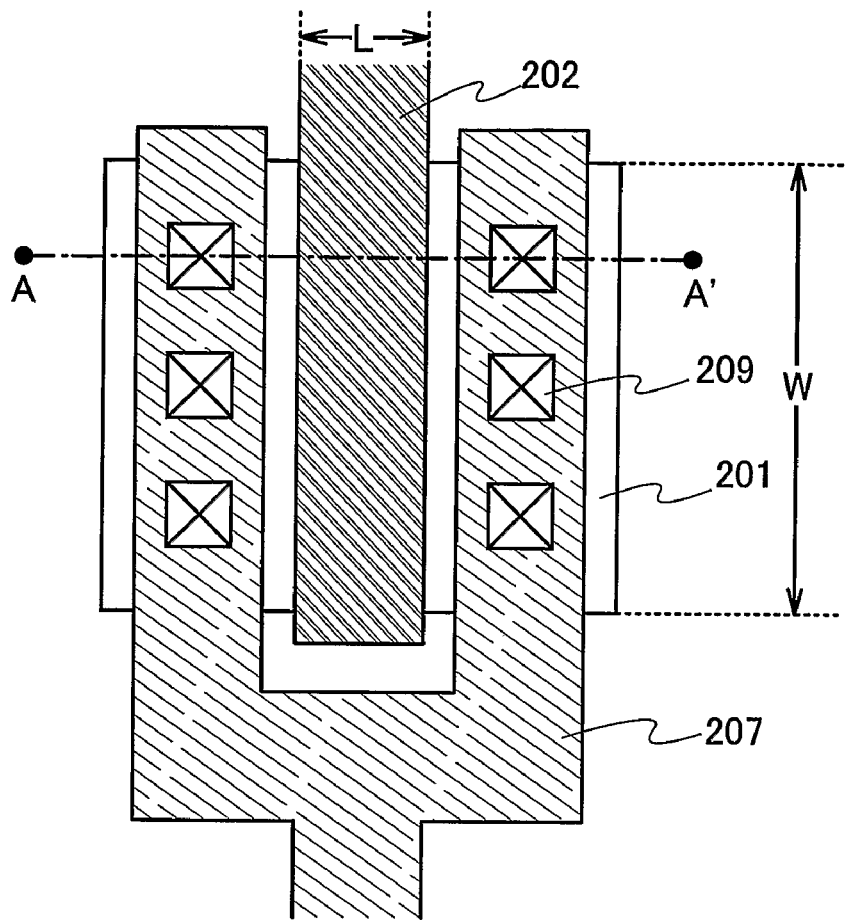
FIGS. 2A and 2B are a top view and a cross-sectional view of the MOS capacitor of the present invention respectively.
Figure 2B:
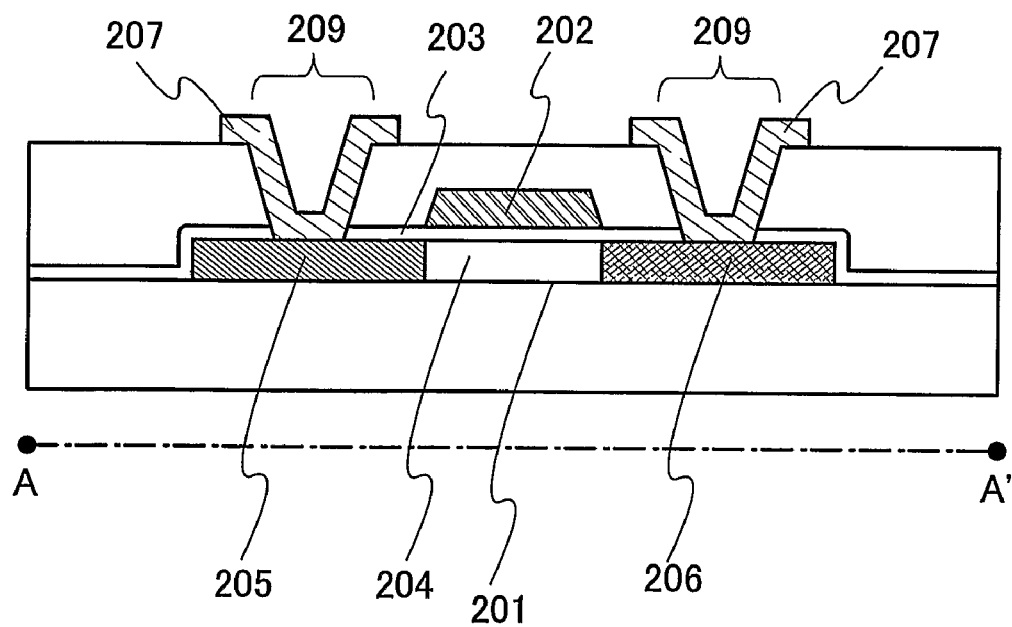

FIG. 2A illustrates a top view of a MOS capacitor in the case of using a thin film transistor (TFT). FIG. 2B illustrates a cross-sectional view of the MOS capacitor shown in FIG. 2A along a line A-A'. Reference numeral 201 denotes an active layer formed of a semiconductor film and 202 denotes a gate electrode. The active layer 201 comprises a channel formation region 204, an N-type region 205 and a P-type region 206, and the channel formation region 204 is interposed between the N-type region 205 and the P-type region 206. In addition, the channel formation region 204 overlaps the gate electrode 202 with the gate insulating film 203 interposed therebetween.

The N-type region 205 and the P-type region 206 are connected to each other by a wiring 207 in contact holes 209. Note that although the N-type region 205 and the P-type region 206 are connected to each other by the wirings 207 in FIGS. 2A and 2B, they may be connected by a plurality of wirings.

The amount of charges that can be accumulated in the MOS capacitor depends on the thickness and the dielectric constant of the gate insulating film 203, as well as the area of the channel formation region 204. When the channel formation region 204 has the same area but has a shorter channel length L, time required for charge accumulation can be reduced.

Note that FIGS. 2A and 2B each illustrates a structure of the MOS capacitor of which active layer has only one channel formation region, however, the present invention is not limited to such a structure. Description is made below with reference to FIGS. 3A and 3B on the structure of a MOS capacitor of which active layer has a plurality of channel formation regions.

Figure 3A:
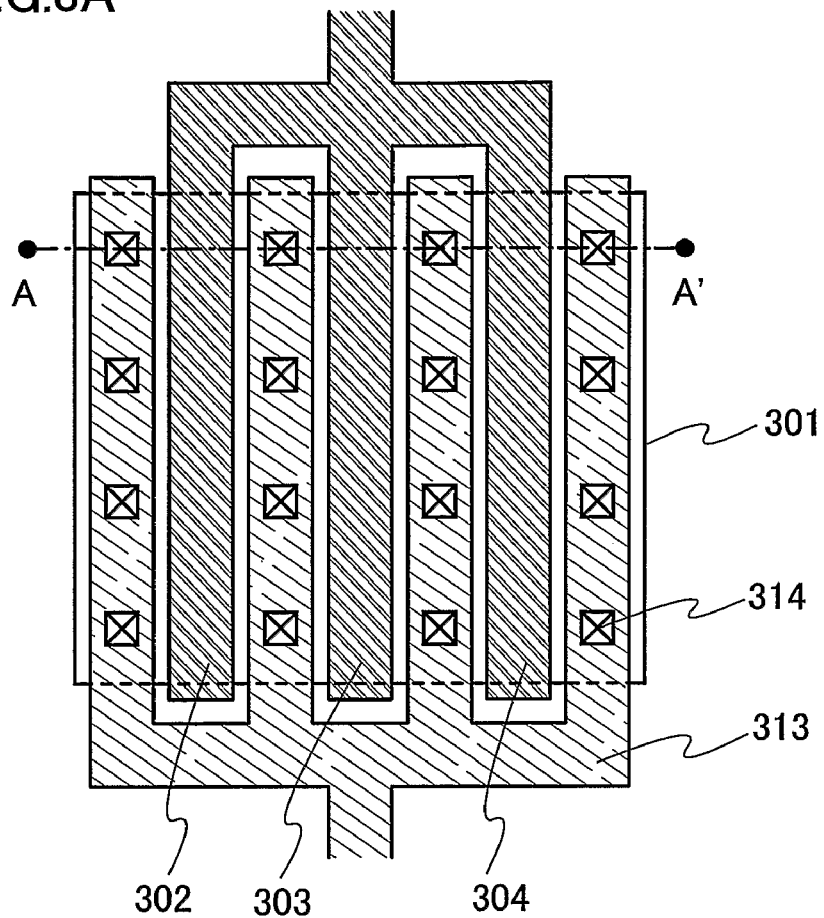
FIGS. 3A and 3B are a top view and a cross-sectional view of the MOS capacitor of the present invention respectively.
Figure 3B:
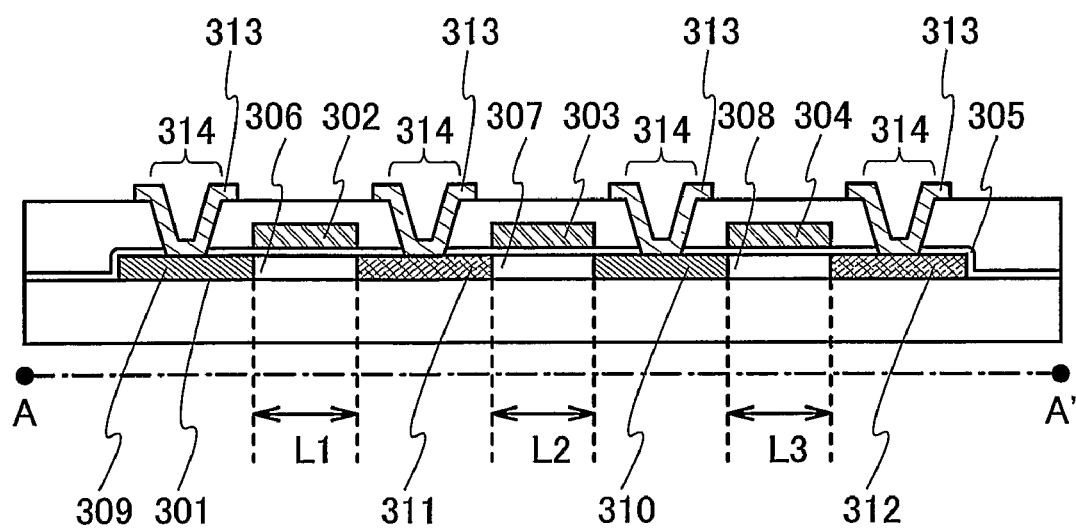

FIG. 3A illustrates a top view of a MOS capacitor that uses a TFT having three channel formation regions. FIG. 3B illustrates a cross-sectional view of the MOS capacitor shown in FIG. 3A along a line A-A'. Reference numeral 301 denotes an active layer formed of a semiconductor film, and 302 to 304 denote gate electrodes.

The active layer 301 comprises channel formation regions 306 to 308, N-type regions 309 and 310, and P-type regions 311 and 312. Each of the channel formation regions 306 to 308 is interposed between the N-type regions 309 and 310, and the P-type regions 311 and 312. Specifically, the channel formation region 306 is interposed between the N-type region 309 and the P-type region 311. The channel formation region 307 is interposed between the P-type region 311 and the N-type region 310. The channel formation region 308 is interposed between the N-type region 310 and the P-type region 312.

In addition, the channel formation region 306 overlaps the gate electrode 302 with the gate insulating film 305 interposed therebetween. The channel formation region 307 overlaps the gate electrode 303 with the gate insulating film 305 interposed therebetween. The channel formation region 308 overlaps the gate electrode 304 with the gate insulating film 305 interposed therebetween.

The N-type regions 309 and 310, and the P-type regions 311 and 312 are connected to each other by a wiring 313 in contact holes 314. Note that although the N-type regions 309 and 310, and the P-type regions 311 and 312 are connected to each other by the wirings 313 in FIGS. 3A and 3B, they may be connected by a plurality of wirings.

The gate electrodes 302 to 304 are formed of one conductive film. Although the gate electrodes 302 to 304 are electrically connected to each other by one conductive film in FIGS. 3A and 3B, the present invention is not limited to such a structure. For example, the gate electrodes 302 to 304 that are independent of each other can be electrically connected by a wiring.

In the case of FIGS. 3A and 3B, the plurality of MOS capacitors connected in parallel jointly function as one MOS capacitor. Also, in FIGS. 3A and 3B, each channel length L1 to L3 of the channel formation regions 306 to 308 can be suppressed even when the channel width W is identical to that of FIGS. 2A and 2B. Therefore, time required for accumulating the same amount of charges can be reduced than the case of FIGS. 2A and 2B.

FIGS. 3A and 3B each illustrates a structure of a MOS capacitor having three channel formation regions, however, the present invention is not limited to such a structure. The MOS capacitor may have two channel formation regions, or four or more channel formation regions. For example, when five channel formation regions are provided, a total of six impurity regions, that is three N-type regions and three P-type regions are provided alternately with each channel formation region interposed therebetween. In addition, five gate electrodes are provided overlapping each channel formation region and an insulating film interposed therebetween.

FIGS. 2A and 2B and FIGS. 3A and 3B each illustrates the case where a TFT is used as a MOS capacitor, however, a transistor used as the MOS capacitor of the present invention is not limited to a TFT. The MOS capacitor of the present invention may be other types of MOS transistor as well.

Figure 4:
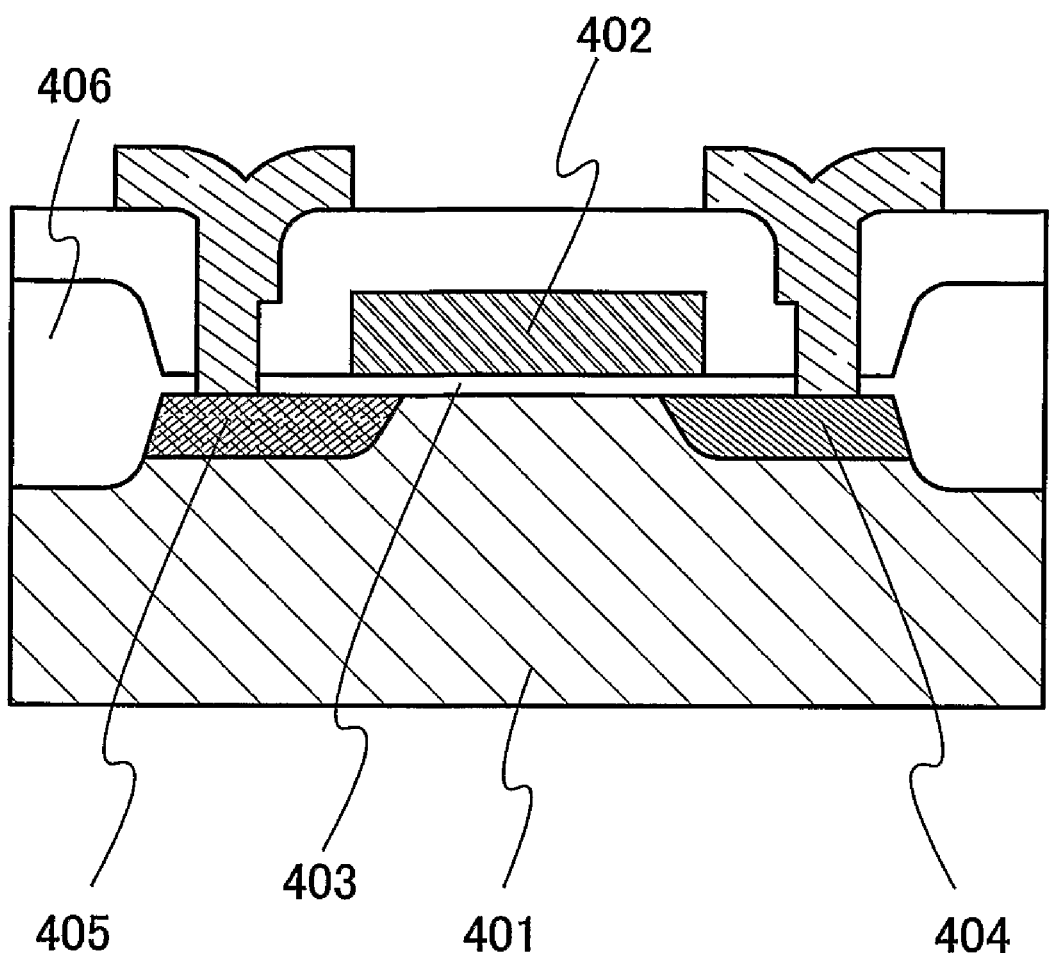
FIG. 4 is a cross-sectional view of the MOS capacitor of the present invention.

FIG. 4 illustrates an example where a transistor formed over a semiconductor substrate is used as a MOS capacitor. In FIG. 4, reference numeral 401 denotes a semiconductor substrate, 402 denotes a gate electrode and 403 denotes a gate insulating film. The semiconductor substrate 401 includes an N-type region 404 and a P-type region 405. The gate electrode 402 overlaps the semiconductor substrate 401 of the region interposed between the N-type region 404 and the P-type region 405, with the gate insulating film 403 interposed therebetween. Reference numeral 406 denotes a field oxide film for electrically insulating elements.

By controlling a voltage between the N-type region 404 or the P-type region 405 and the gate electrode 402, a channel can be formed in the semiconductor substrate 401 of the region interposed between the N-type region 404 and the P-type region 405, which is closer to the gate insulating film 403.

Embodiment 1

In this embodiment, description is made on an example where the MOS capacitor of the present invention is used as a storage capacitor in a pixel of a liquid crystal display device.

Figure 5:
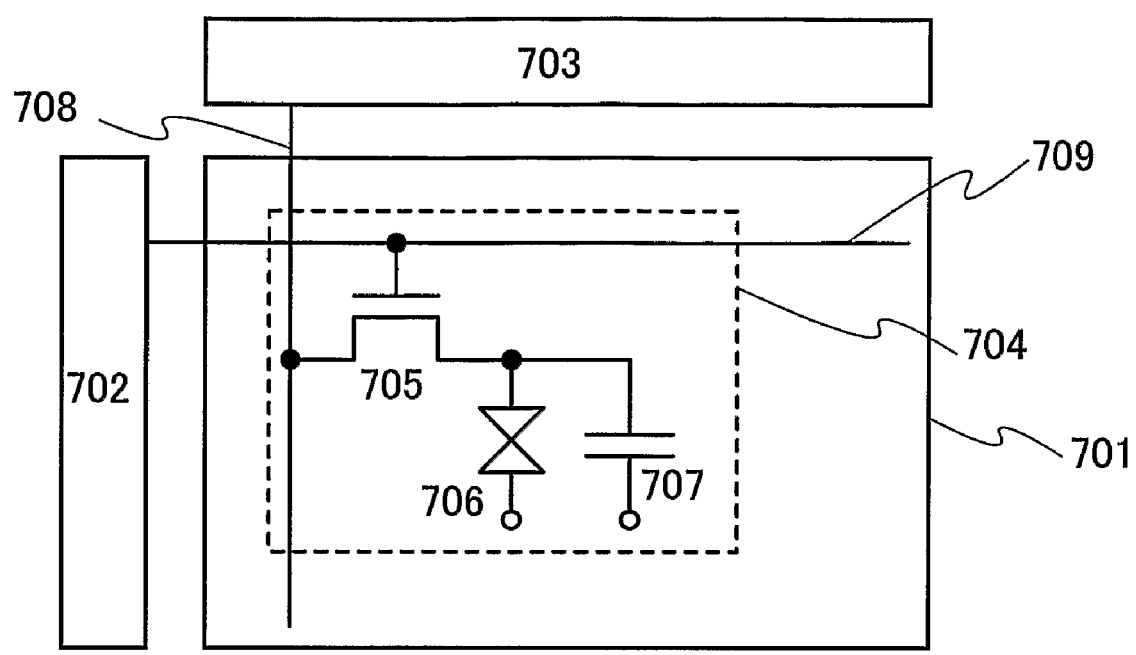
FIG. 5 is a diagram illustrating a configuration of a liquid crystal display device using the MOS capacitor of the present invention.

FIG. 5 is a block diagram illustrating a configuration of a liquid crystal display device. In FIG. 5, reference numeral 701 denotes a pixel portion, 702 denotes a scan line driver circuit and 703 denotes a signal line driver circuit. In the pixel portion 701, a plurality of pixels 704 are arranged in matrix. Note that FIG. 5 illustrates only one pixel 704. The pixel 704 comprises a TFT 705 functioning as a switching element, a liquid crystal cell 706 and a storage capacitor 707. The liquid crystal cell 706 includes a pixel electrode, a counter electrode and a liquid crystal interposed between them.

In the pixel portion 701, a signal line 708 and a scan line 709 are formed. A gate electrode of the TFT 705 is connected to the scan line 709. One of a source region and a drain region of the TFT 705 is connected to the signal line 708 while the other is connected to the pixel electrode of the liquid crystal cell 706. One of two electrodes of the storage capacitor 707 is connected to the pixel electrode of the liquid crystal cell 706 while the other is connected to the counter electrode of the liquid crystal cell 706.

The scan line driver circuit 702 can control input of selection signals to the scan line 709. The signal line driver circuit 703 can control input of video signals to the signal line 708. When the TFT 705 is turned ON by a selection signal, a voltage of a video signal inputted to the signal line 708 is supplied to the pixel electrode of the liquid crystal cell 706 and one of the electrodes of the storage capacitor 707. The transmissivity of the liquid crystal cell 706 is controlled by a voltage between the pixel electrode and the counter electrode. In addition, the voltage between the pixel electrode and the counter electrode of the liquid crystal cell 706 is applied to the storage capacitor 707, and stored therein.

When the same voltage is continuously applied between the pixel electrode and the counter electrode of the liquid crystal cell 706, the liquid crystal is degraded. Therefore, generally, inversion drive is performed where voltages inverted from each other are alternately applied between the pixel electrode and the counter electrode of the liquid crystal cell 706 at regular intervals. As the inversion drive, there are a method of inverting a voltage of a pixel electrode while maintaining a counter electrode at a fixed voltage, a method of inverting a voltage of a counter electrode while maintaining a pixel electrode at a fixed voltage, and a method of simultaneously changing a voltage of a pixel electrode and a voltage of a counter electrode. In any case, a voltage applied to the storage capacitor 707 is inverted.

Figure 15A:
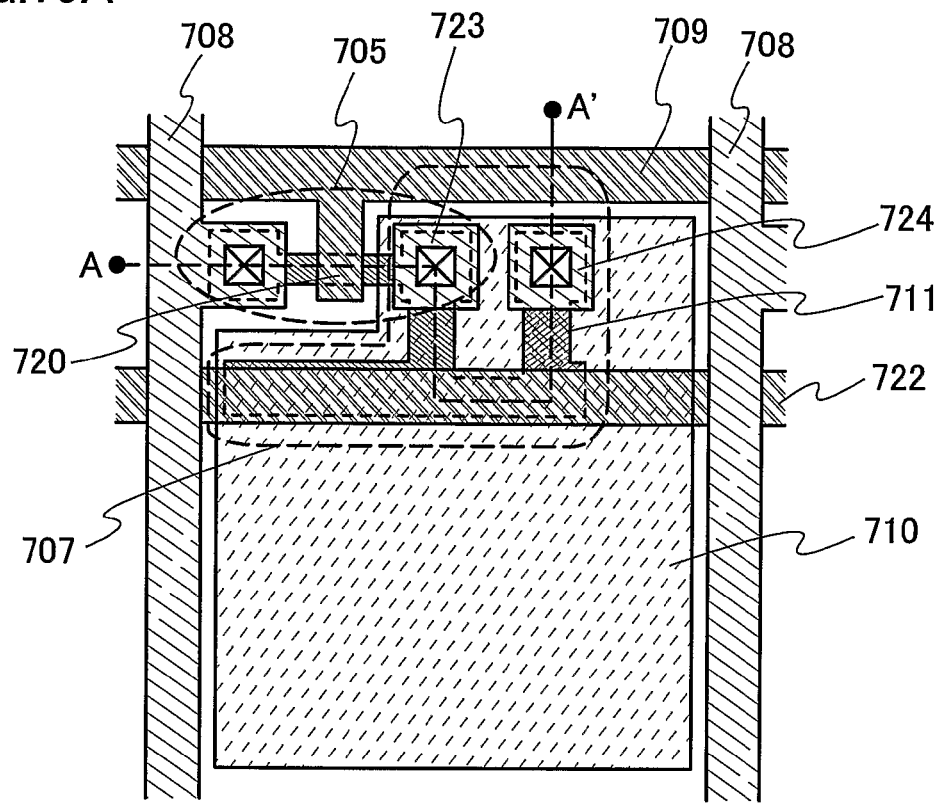
FIGS. 15A and 15B are a top view and a cross-sectional view of a liquid crystal display device using the MOS capacitor of the present invention respectively.
Figure 15B:
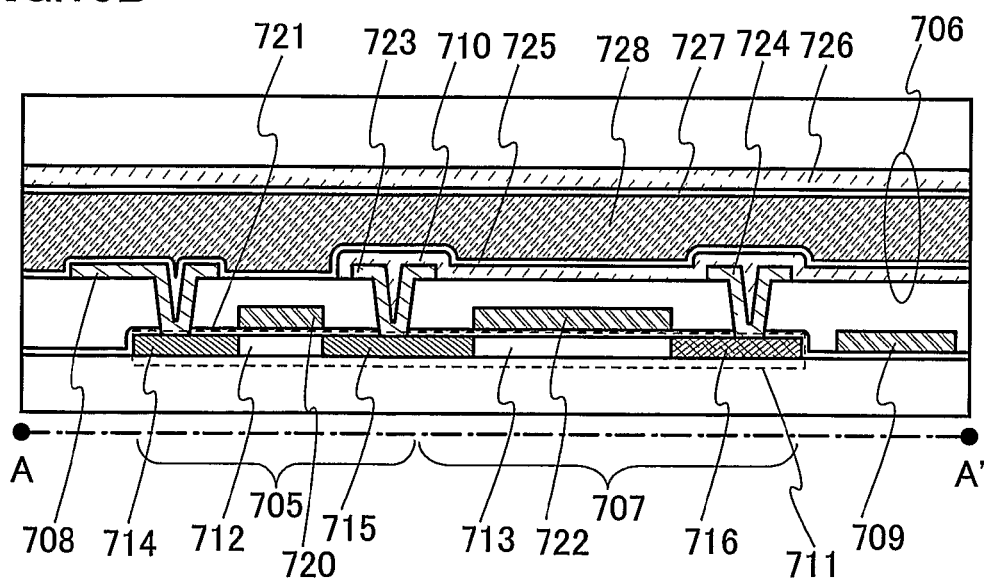

FIG. 15A illustrates an exemplary top view of the pixel 704 in the case were the MOS capacitor of the present invention is used as the storage capacitor 707. FIG. 15B illustrates a cross-sectional view of FIG. 15A along a line A-A'. In FIG. 15B, a portion of the scan line 709 functions as a gate electrode 720 of the TFT 705.

The storage capacitor 707 and the TFT 705 share an active layer 711. The active layer 711 comprises a channel formation region 712 of the TFT 705, a channel formation region 713 of the storage capacitor 707, N-type regions 714 and 715, and a P-type region 716. In the TFT 705, the gate electrode 720 overlaps the channel formation region 712 with a gate insulating film 721 interposed therebetween. In the storage capacitor 707, a gate electrode 722 overlaps the channel formation region 713 with the gate insulating film 721 interposed therebetween.

The channel formation region 712 is also interposed between the N-type regions 714 and 715, and the N-type regions 714 and 715 function as a source region or a drain region of the TFT 705. The channel formation region 713 is interposed between the N-type region 715 and the P-type region 716, and the N-type region 715 and the P-type region 716 function as a source region or a drain region of the storage capacitor 707.

The N-type region 714 is connected to the signal line 708. The N-type region 715 is connected to a wiring 723. The P-type region 716 is connected to a wiring 724. Reference numeral 710 corresponds to the pixel electrode of the liquid crystal cell 706, and the wirings 723 and 724 are each connected to the pixel electrode 710. Over the pixel electrode 710, an alignment film 725 is formed.

Reference numeral 726 denotes a counter electrode, over which an alignment film 727 is formed. A liquid crystal 728 is interposed between the pixel electrode 710 and the alignment film 725, and the counter electrode 726 and the alignment film 727. The liquid crystal cell 706 is formed by the pixel electrode 710, the liquid crystal 728 and the counter electrode 726.

Note that the configuration of the liquid crystal display device shown in FIG. 5 is only an embodiment, therefore, the semiconductor display device of the present invention is not limited to the configuration shown in FIG. 5.

Embodiment 2

The MOS capacitor of the present invention can also be used as a capacitor that is connected to an antenna for constructing a resonant circuit in a semiconductor device such as an ID chip and an IC chip capable of wireless data communication (e.g., identification of data). Note that the ID chip is also referred to as a wireless tag, an RFID (Radio Frequency IDentification) tag, an IC card and a wireless chip. Each of the ID chip, the IC card and the wireless chip comprises an antenna and an integrated circuit.

The ID chip and the IC card can communicate with a reader/writer by utilizing radio waves. Specifically, the ID chip and the IC card can transmit signals to the reader/writer by operating an integrated circuit using an AC voltage, which is generated in an antenna by radio waves generated from the reader/writer, and modulating signals generated in the antenna using signals outputted from the integrated circuit.

Figure 6:
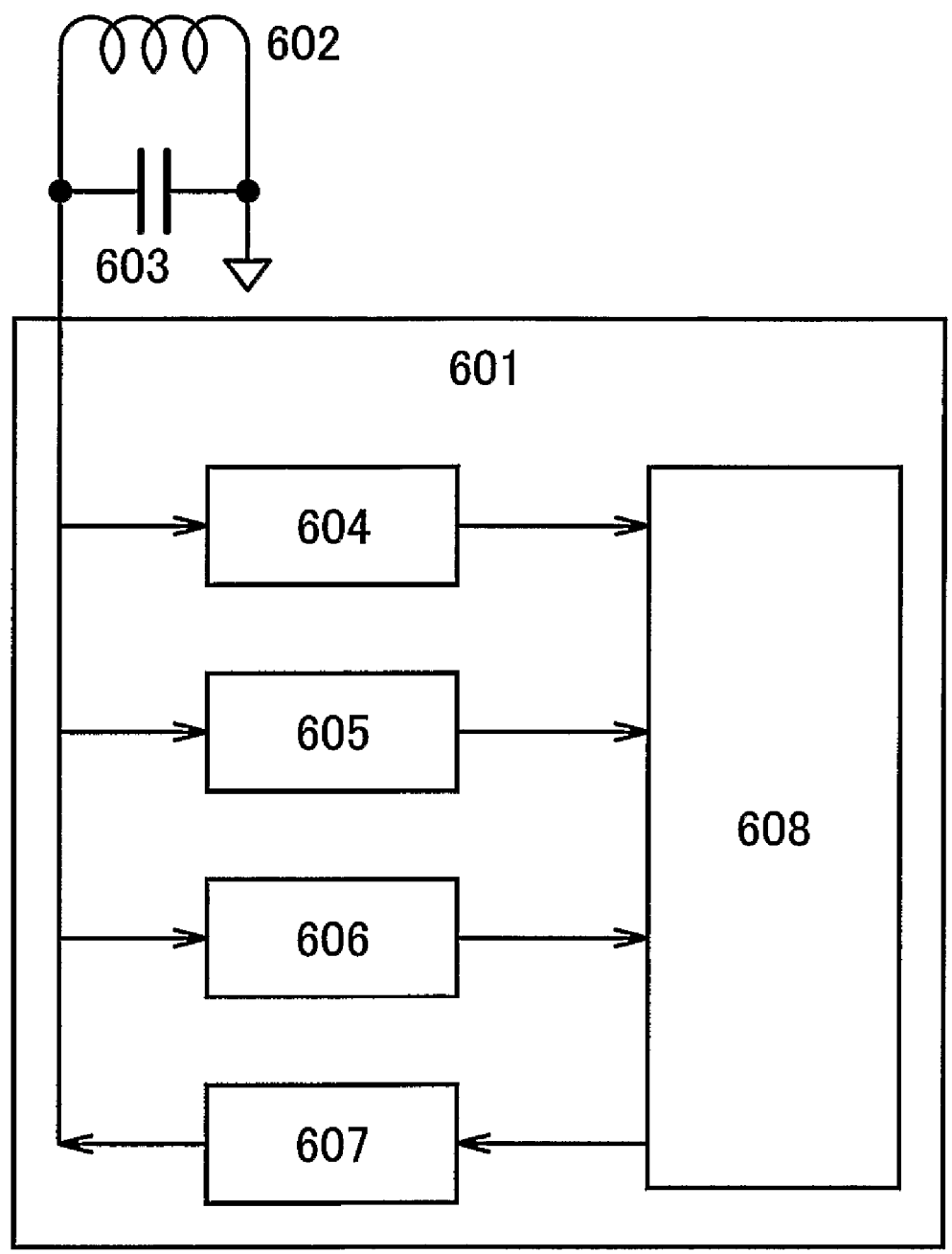
FIG. 6 is a block diagram illustrating a functional configuration of an IC chip or an ID chip using the MOS capacitor of the present invention.

FIG. 6 is a block diagram illustrating an exemplary functional configuration of the IC chip or the ID chip of this embodiment. In FIG. 6, reference numeral 610 denotes an integrated circuit and 602 denotes an antenna. A capacitor 603 is connected to opposite terminals of the antenna 602. The MOS capacitor of the present invention can be used as the capacitor 603.

The integrated circuit 601 comprises a rectification circuit 604, a clock generation circuit 605, a demodulation circuit 606, a modulation circuit 607, and a logic circuit portion 608. The logic circuit portion 608 may include various arithmetic circuits, a memory and the like. As a memory, for example, an SRAM, a flash memory, a ROM or an FeRAM (Ferroelectric RAM) and the like may be used.

Signals transmitted as radio waves from the reader/writer are converted into an AC voltages by electromagnetic induction in the antenna 602. The demodulation circuit 606 generates signals by demodulating the AC voltage, and inputs them to the logic circuit portion 608 of the subsequent stage. The rectification circuit 604 generates a power supply voltage by using an AC voltage, and supplies it to the logic circuit portion 608.

The logic circuit portion 608 performs various processing using the signals inputted from the demodulation circuit 606 and the power supply voltage supplied from the rectification circuit 604. By the various processing of the logic circuit portion 608, signals are transmitted from the logic circuit portion 608 to the modulation circuit 607. The modulation circuit 607 can modulate signals generated in the antenna 602 in accordance with the signals from the logic circuit portion 608. The reader/writer can receive signals from the logic circuit portion 608 by receiving such modulated signals generated in the antenna 602 as radio waves.

As described in the aforementioned operation, an AC voltage is applied between the opposite terminals of the antenna 602, therefore, the capacitor 603 is required to be a non-conductive capacitor. Since the MOS capacitor of the present invention is a non-conductive capacitor, it can be suitably used as the capacitor 603. The MOS capacitor of the present invention can be formed simultaneously with a transistor used in the integrated circuit 601, therefore, the number of the manufacturing steps of the semiconductor device can be suppressed.

Note that the MOS capacitor of the present invention can be used not only as a capacitor connected to the opposite terminals of the antenna 602, but also as other capacitors formed in the integrated circuit 601.

Note that this embodiment illustrates the configuration of the semiconductor device that performs signal transmission/reception by an electromagnetic induction method, however, the present invention is not limited to such a configuration. The semiconductor device capable of wireless communication that falls within the category of the present invention can adopt an electromagnetic coupling method, a microwave method or other transmission methods.

Embodiment 3

Description is made below on a specific manufacturing method of an ID chip as one mode of the semiconductor device of the present invention. In this embodiment, TFTs and a MOS capacitor are shown as exemplary semiconductor elements, however, semiconductor elements used in an integrated circuit are not limited to these. For example, memories, diodes, photoelectric converters, resistors, coils or inductors can be used as the semiconductor elements.

Figure 7A:
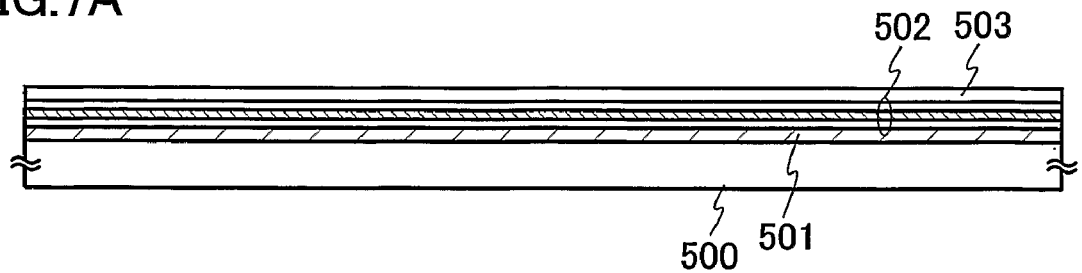
FIGS. 7A to 7E are diagrams illustrating a manufacturing method of the semiconductor device of the present invention.

First, as shown in FIG. 7A, a peeling layer 501 is formed over a heat-resistant first substrate 500. The first substrate 500 may be a glass substrate such as barium borosilicate glass and alumino borosilicate glass, a quartz substrate, a ceramic substrate and the like. Alternatively, it may be a metal substrate including a stainless (SUS) substrate or a semiconductor substrate. Generally, a substrate formed of a flexible synthetic resin such as plastics tends to have a low heat-resistance temperature as compared to the aforementioned substrates, however, it can be utilized as long as it can withstand the processing temperature in the manufacturing steps.

The peeling layer 501 may be formed by using a layer containing silicon as its main component such as amorphous silicon, polycrystalline silicon, single crystalline silicon and microcrystalline silicon (including semi-amorphous silicon). The peeling layer 501 may be formed by sputtering, low pressure CVD, plasma CVD and the like. In this embodiment, amorphous silicon is formed to have a thickness of about 50 nm by plasma CVD to be used as the peeling layer 501. The peeling layer 501 that is formed by plasma CVD can, unlike sputtering, prevent dust from being mixed into the peeling layer 501, and suppress the amount of Ar contained in the peeling layer 501. Accordingly, it can be prevented that the peeling layer 501 peels off a base film 502 that is formed later by dust or Ar even when thermal treatment including laser crystallization is applied to the peeling layer 501 in the subsequent step. Note that the peeling layer 501 may be formed by using not only silicon but also other materials as long as they can be selectively removed by etching. The peeling layer 501 is desirably 10 to 100 thick.

Next, the base film 502 is formed over the peeling layer 501. The base film 502 is provided in order to prevent that alkaline metals such as Na or alkaline earth metals contained in the first substrate 500 are diffused into the semiconductor film, which would otherwise have an adverse effect on the characteristics of semiconductor elements such as TFTs. The base film 502 also functions to protect the semiconductor elements in the subsequent step of peeling the semiconductor elements. The base film 502 may be formed by using an insulating film such as a silicon oxide film, a silicon oxynitride film, a silicon nitride film and a silicon nitride oxide film.

The base film 502 may be either a single-layer insulating film or a multi-layer insulating film. In this embodiment, the base film 502 is formed by sequentially stacking a silicon oxynitride film (100 nm), a silicon nitride oxide film (50 nm) and a silicon oxynitride film (100 nm), however, materials and thickness of each film, and the number of layers are not limited to these. For example, in place of the silicon oxynitride film in the bottom layer, a siloxane-based resin film may be formed to have a thickness of 0.5 to 3 μm by spin coating, slit coating, droplet discharge method, printing method and the like. In addition, in place of the silicon nitride oxide film in the middle layer, a silicon nitride film (e.g., $SiN_x$ and $Si_3N_4$) may be used. Further, in place of the silicon oxynitride film in the top layer, a silicon oxide film may be used. It is desirable that each film have a thickness of 0.05 to 3 μm, and the thickness may be arbitrarily selected within the range.

Alternatively, such combination is possible that the bottom layer of the base film 502 that is closest to the peeling layer 501 is formed of a silicon oxynitride film or a silicon oxide film, the middle layer is formed of a siloxane-based resin film, and the top layer is formed of a silicon oxide film.

Note that a siloxane-based resin is a resin having Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be used as the substituent. Further alternatively, a fluoro group and an organic group containing at least hydrogen may be used as the substituent.

The silicon oxide film may be formed by thermal CVD, plasma CVD, normal pressure CVD, bias ECRCVD and the like using a mixed gas of $SiH_4$ and $O_2$, a mixed gas of TEOS (tetraethoxysilane) and $O_2$, and the like. The silicon nitride film may typically be formed by plasma CVD using a mixed gas of $SiH_4/NH_3$. The silicon oxynitride film and the silicon nitride oxide film may typically be formed by plasma CVD using a mixed gas of $SiH_4$ and $N_2O$.

Next, a semiconductor film 503 is formed over the base film 502. The semiconductor film 503 is desirably formed without being exposed to the atmosphere after the formation of the base film 502. The semiconductor film 503 is formed to have a thickness of 20 to 200 nm (preferably 40 to 170 nm, and more preferably 50 to 150 nm). Note that the semiconductor film 503 may be any one of an amorphous semiconductor, a semi-amorphous semiconductor and a polycrystalline semiconductor. The semiconductor may be silicon germanium as well as silicon. In the case of using silicon germanium, the concentration of germanium is preferably 0.01 to 4.5 atomic %.

The semiconductor film 503 may be crystallized by a known technique. As known crystallization, there are laser crystallization using laser light, and crystallization using catalytic elements. Alternatively, crystallization using catalytic elements may be combined with laser crystallization. In addition, in the case of using a highly heat-resistant substrate such as quartz as the first substrate 500, thermal crystallization using an electrically heated reactor, crystallization by lamp annealing using infrared light, crystallization using catalytic elements, crystallization by high-temperature annealing of around 905° C. may be combined.

In the case of using laser crystallization, for example, heat treatment is applied to the semiconductor film 503 at 550° C. for 4 hours before laser crystallization in order to enhance the resistance of the semiconductor film 503 to laser. By using a solid-state laser capable of continuous oscillation, and irradiating the semiconductor film 503 with laser light of the second to fourth harmonics of the fundamental wave, crystals of a large grain size can be obtained. Typically, it is desirable to use the second harmonic (532 nm) or the third harmonic (355 nm) of an $Nd:YVO_4$ laser (fundamental wave: 1064 nm), for example. Specifically, laser light emitted from a continuous-wave $YVO_4$ laser is converted into a higher harmonic by use of a non-linear optical element to obtain laser light of 10 W. The laser light is preferably transformed to have a rectangular or elliptical shape on the irradiation surface using an optical system, and then the semiconductor film 503 is irradiated with the laser light. The energy density at this time is required to be around 0.01 to 100 $MW/cm^2$ (preferably, 0.1 to 10 $MW/cm^2$). Irradiation is carried out at a scan speed of around 10 to 2000 cm/sec.

Alternatively, laser crystallization may be performed by setting the repetition frequency of pulsed laser light at 10 MHz or more, and using an extremely higher frequency band than a normally-used frequency band that is several ten to several hundred Hz. It is said that it takes several ten to several hundred nsec until a semiconductor film is completely solidified after being irradiated with pulsed laser light. Accordingly, the use of the aforementioned frequency makes it possible for the semiconductor film to be irradiated with the next pulsed laser light before it is solidified after being fused by the previous laser. Thus, a solid-fluid interface of the semiconductor film can be continuously moved, whereby a semiconductor film having crystal grains that are continuously aligned in the scan direction can be obtained. Specifically, an aggregation of crystal grains having a width of 10 to 30 µm in the scan direction, and a width of 1 to 5 µm in the perpendicular direction to the scan direction can be formed. By forming crystal grains of single crystals that are aligned in the scan direction, a semiconductor film having few crystal grain boundaries at least in the channel direction of a TFT can be obtained.

Note that laser crystallization may be performed such that continuous-wave laser light of a fundamental wave is irradiated in parallel with continuous-wave laser light of a high harmonic, or such that continuous-wave laser light of a fundamental wave is irradiated in parallel with pulsed laser light of a high harmonic.

Note that laser light may be irradiated in an inert gas atmosphere such as a rare gas and a nitrogen gas.

According to the aforementioned irradiation of laser light, the semiconductor film 503 having enhanced crystallinity is obtained. Note that the semiconductor film 503 may also be formed by using a polycrystalline semiconductor that is formed by sputtering, plasma CVD, thermal CVD and the like.

In addition, although the semiconductor film 503 is crystallized in this embodiment, crystallization may be omitted and a subsequent process described below may be carried out while maintaining in the amorphous silicon film or the microcrystalline semiconductor film. A TFT utilizing an amorphous semiconductor or a microcrystalline semiconductor has an advantage that cost reduction and higher yield can be achieved since it requires a smaller number of manufacturing steps as compared to a TFT utilizing a polycrystalline semiconductor.

An amorphous semiconductor can be obtained by decomposing a silicon gas by glow discharge. As the typical silicon gas, there are $SiH_4$ and $S_2H_6$. Such a silicon gas may be diluted with hydrogen, or hydrogen and helium.

Note that the semi-amorphous semiconductor has an intermediate structure between amorphous and crystalline (including single crystalline and polycrystalline) structures. The semi-amorphous semiconductor is a semiconductor having a third state that is stable in free energy, and includes a crystalline region having a short-range order and lattice distortion. The semi-amorphous semiconductor having crystalline grains of 0.5 to 20 nm in size can be dispersed into a non-single crystalline semiconductor. Also, it has the characteristic that Raman spectrum is shifted to the lower frequency than 520 $cm^{-1}$, and has the observed diffraction peaks at (111) and (220) by the X-ray diffraction that is supposedly caused by the Si-crystal lattices. In addition, it contains hydrogen or halogen with a concentration of 1 atomic % or more in order to terminate dangling bonds. Such a semiconductor is called a semi-amorphous semiconductor (SAS) here for convenience. Further, a stable and superior semi-amorphous semiconductor can be obtained when the lattice distortion is further promoted by adding rare gas elements such as helium, argon, krypton and neon.

The SAS can be obtained by decomposing a silicon gas by glow discharge as well. As the typical silicon gas, $SiH_4$ may be used as well as other silicon gas such as $Si_2H_6$, $SiH_2Cl_2$, $SiHCl_3$, $SiCl_4$ and $SiF_4$. In addition, manufacture of the SAS can be facilitated when the silicon gas is diluted with hydrogen or a mixed gas of hydrogen and one or more rare gas elements selected from helium, argon, krypton and neon. The silicon gas is preferably diluted to a ratio of 2 to 1000 times. Further, the silicon gas may be mixed with a carbon gas such as $CH_4$ and $C_2H_6$, a germanium gas such as $GeH_4$ and $GeF_4$ or $F_2$ while controlling the energy bandwidth to be 1.5 to 2.4 eV or 0.9 to 1.1 eV.

For example, when a mixed gas of $SiH_4$ and $H_2$, or a mixed gas of $SiH_4$ and $F_2$ is used to form a semi-amorphous semiconductor for manufacturing a TFT, the TFT can have a sub-threshold value (S value) of 0.35 V/sec or less, and typically 0.25 to 0.09 V/sec, and mobility of 10 $cm^2$/Vsec. In addition, when constructing a 19-stage ring oscillator with a TFT using the aforementioned amorphous semiconductor, for example, a repetition frequency of 1 MHz or more, and more preferably 100 MHz or more can be obtained with a power supply voltage of 3 to 5 V. In addition, delay time per stage of the inverter can be suppressed down to 26 ns, and more preferably 0.26 ns or less.

Figure 7B:
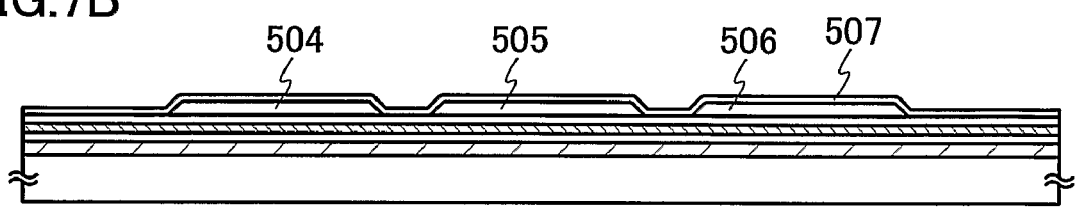

Then, as shown in FIG. 7B, the crystallized semiconductor film 503 is patterned to obtain island-like semiconductor films 504 to 506. Then, a gate insulating film 507 is formed covering the island-like semiconductor films 504 to 506. The gate insulating film 507 may be formed by plasma CVD, sputtering and the like to have single or multiple layers of a silicon nitride film, a silicon oxide film, a silicon nitride oxide film or a silicon oxynitride film. In the case of stacking multiple layers, for example, a three-layer structure is preferably employed where a silicon oxide film, a silicon nitride film and a silicon oxide film are stacked in this order over the substrate.

Figure 7C:
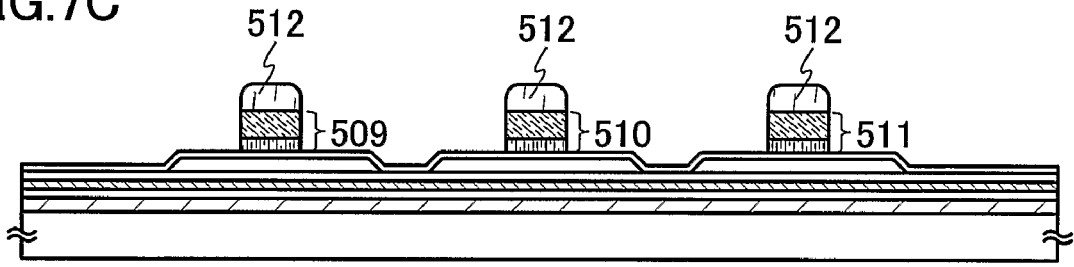

Then, as shown in FIG. 7C, gate electrodes 509 to 511 are formed. In this embodiment, the gate electrodes 509 to 511 are formed by sequentially stacking silicon doped with N-type impurities, WN and W by sputtering, and etching them by using a mask 512. Needless to say, materials, structure and manufacturing method of the gate electrodes 509 to 511 are not limited to these, and they may be selected appropriately. For example, a stacked-layer structure of silicon doped with N-type impurities and NiSi (Nickel Silicide), a stacked-layer structure of Si doped with N-type impurities, Si and $WSi_x$, or a stacked-layer structure of TaN (tantalum nitride) and W (tungsten) may be employed. Alternatively, a single-layer electrode may be formed by using various conductive materials.

Alternatively, a mask of silicon oxide or the like may be used in place of the resist mask. In such a case, an additional step of forming a mask of silicon oxide, silicon oxynitride or the like (referred to as a hard mask) by patterning is required, in which case the mask is reduced in thickness to a lesser degree than the resist in etching, therefore, the gate electrodes 509 to 511 having a desired width can be formed. Alternatively, the gate electrodes 509 to 511 may be formed selectively by a droplet discharge method without using the mask 512.

As the conductive material, various materials may be selected in accordance with the function of the conductive film. In addition, in the case of forming the gate electrodes and an antenna simultaneously, materials are required to be selected in consideration of their functions.

Note that the gate electrodes are etched by using an etching gas such as a mixed gas of $CF_4$, $Cl_2$ and $O_2$, or a $Cl_2$ gas, however, the present invention is not limited to these.

Figure 7D:
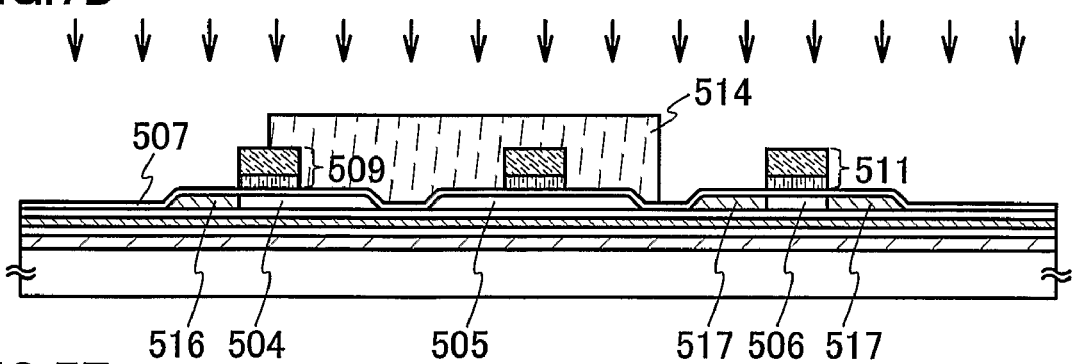

Next, as shown in FIG. 7D, after removing the mask 512, the island-like semiconductor film 505 to be a P-channel TFT, and a portion of the island-like semiconductor film 504 to be a MOS capacitor are covered with a mask 514, and N-type impurities (typically, P: Phosphorous or As: Arsenic) are doped to the island-like semiconductor films 504 and 506 at a low concentration using the gate electrodes 509 and 511 also as masks (first doping step). The first doping step is performed under the conditions of a dosage: $1\times10^{13}$ to $6\times10^{13}$/cm$^2$ and an acceleration voltage: 50 to 70 keV. However, the present invention is not limited to these. According to the first doping step, doping is performed through the gate insulating film 507, whereby a low concentration impurity region 516 is formed in the island-like semiconductor film 504, and a pair of low concentration impurity regions 517 are formed in the island-like semiconductor film 506. Note that the first doping step may be performed without covering the island-like semiconductor film 505 to be a P-channel TFT and the portion of the island-like semiconductor film 504 to be a MOS capacitor with the mask 514.

Figure 7E:
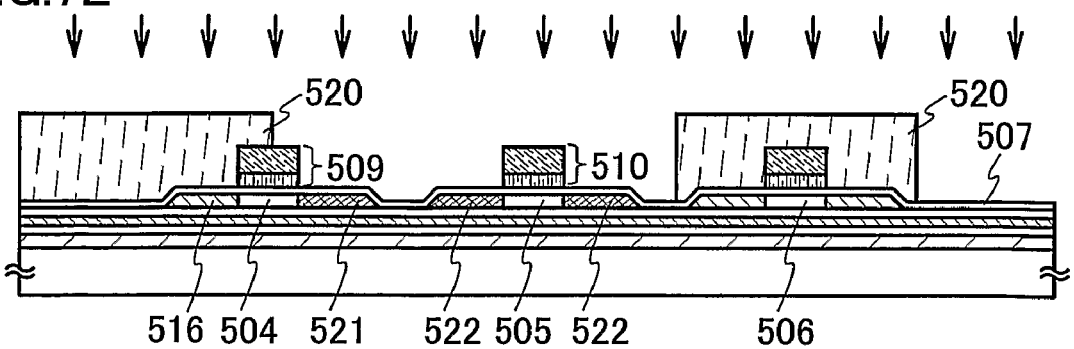

Next, as shown in FIG. 7E, after removing the mask 514 by ashing and the like, masks 520 are formed covering the island-like semiconductor film 506 to be an N-channel TFT, and the low concentration impurity region 516 of the island-like semiconductor film 504 to be a MOS capacitor. Then, using the gate electrodes 509 and 510 also as masks, the island-like semiconductor films 504 and 505 are doped with P-type impurities (typically, B: Boron) at a high concentration (second doping step). The second doping step is performed under the conditions of a dosage: $1\times10^{16}$ to $3\times10^{16}$/cm$^2$ and an acceleration voltage: 20 to 40 keV. According to the second doping step, doping is performed through the gate insulating film 507, whereby a P-type high concentration impurity region 521 is formed in the island-like semiconductor film 504, and a pair of P-type high concentration impurity regions 522 are formed in the island-like semiconductor film 505.

Figure 8A:
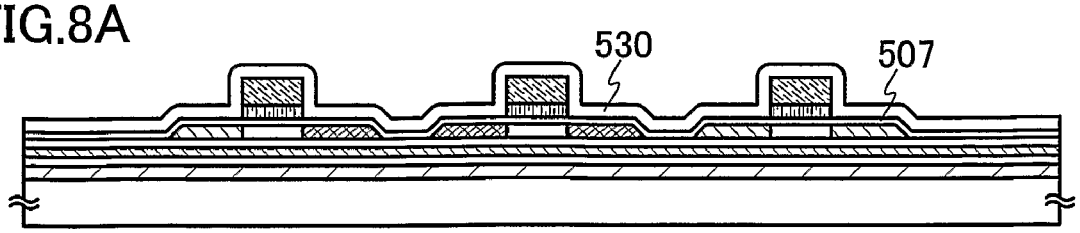
FIGS. 8A to 8E are diagrams illustrating a manufacturing method of the semiconductor device of the present invention.
Figure 8B:
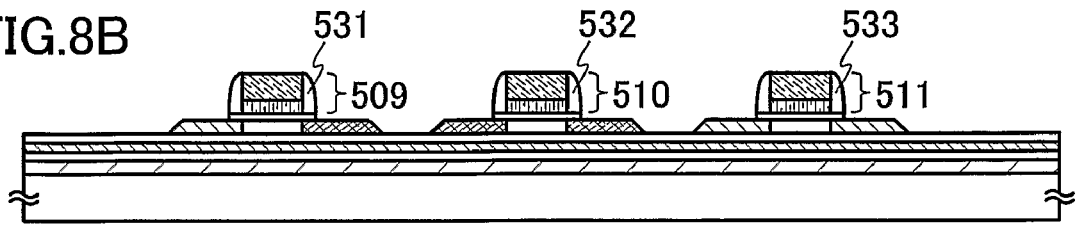

Then, as shown in FIG. 8A, after removing the masks 520 by ashing and the like, an insulating film 530 is formed covering the gate insulating film 507 and the gate electrodes 509 to 511. In this embodiment, a silicon oxide film is formed to have a thickness of 100 nm by plasma CVD. After that, the insulating film 530 and the gate insulating film 507 are partially etched by etch back, whereby sidewalls 531 to 533 are formed in a self-aligned manner so as to be in contact with side faces of the gate electrodes 509 and 511. As the etching gas, a mixed gas of $CHF_3$ and He is used. Note that the steps of forming sidewalls are not limited to these.

Note that in the case where an insulating film is formed on the back side of the first substrate 500 also when forming the insulating film 530, the insulating film formed on the back side may be selectively etched to be removed by using a resist. In this case, the resist may be etched to be removed simultaneously with the insulating film 530 and the gate insulating film 507 in the formation of the sidewalls 531 to 533 by etch back.

Figure 8C:
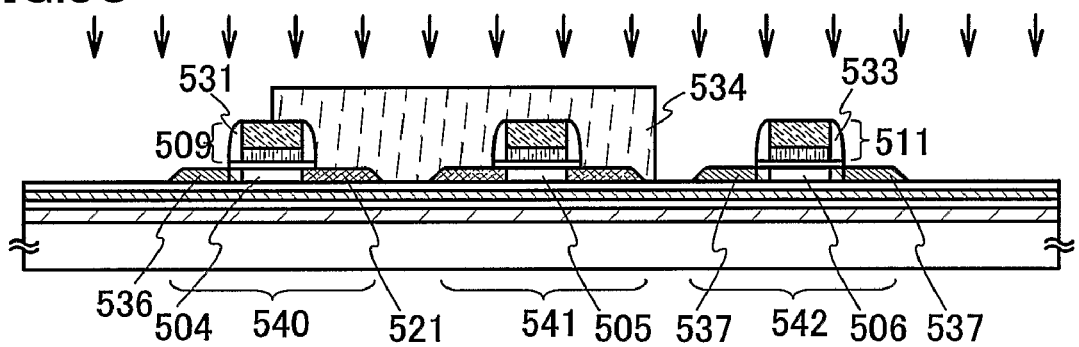

Next, as shown in FIG. 8C, a mask 534 is formed covering the island-like semiconductor film 505 to be a P-channel TFT and the P-type high concentration impurity region 521 of the island-like semiconductor film 504 to be a MOS capacitor. Then, N-type impurity elements (typically, P or As) are doped at a high concentration using the gate electrodes 509 and 511, and the sidewalls 531 and 533 as masks (third doping step). The third doping step is performed under the conditions of a dosage: $1\times10^{13}$ to $5\times10^{15}$/cm$^2$ and an acceleration voltage: 60 to 100 keV. According to the third doping step, an N-type high concentration impurity region 536 is formed in the island-like semiconductor film 504, and a pair of N-type high concentration impurity regions 537 are formed in the island-like semiconductor film 506.

Note that the sidewalls 531 and 533 function as masks for forming a low concentration impurity region or a non-doped offset region under the sidewalls 531 and 533 by doping N-type impurities at a high concentration. Accordingly, in order to control the width of the low-concentration impurity region or the offset region, the size of the sidewalls 531 and 533 is required to be controlled by appropriately changing the conditions of the etch back for forming the sidewalls 531 and 533, or the thickness of the insulating film 530.

Then, after removing the mask 534 by ashing and the like, the impurity regions may be activated by heat treatment. For example, after depositing a silicon oxynitride film to have a thickness of 50 nm, heat treatment may be performed in a nitrogen atmosphere at 550° C. for 4 hours.

Alternatively, after forming a silicon nitride film containing hydrogen to have a thickness of 100 nm, heat treatment may be performed in a nitrogen atmosphere at 410° C. for 1 hour, and then the island-like semiconductor films 504 to 506 may be hydrogenated. Further alternatively, heat treatment may be performed in an atmosphere containing hydrogen at 300 to 450° C. for 1 to 12 hours, and then the island-like semiconductor films 504 to 506 may be hydrogenated. In addition, as an alternative means for hydrogenation, plasma hydrogenation (using hydrogen excited by plasma) may be performed. According to such a hydrogenation step, dangling bonds can be eliminated by hydrogen that is thermally excited. Further, by setting the concentration of hydrogen contained in the semiconductor film to be $1\times10^{19}$ to $1\times10^{22}$ atoms/cm$^3$ or preferably $1\times10^{19}$ to $5\times10^{20}$ atoms/cm$^3$ by hydrogenation, defects that might be generated in the semiconductor film when a flexible second substrate 559, to which semiconductor elements are stuck in the subsequent step, is bent can be eliminated by the hydrogen contained in the semiconductor film. Alternatively, in order to terminate the defects, the semiconductor film may contain halogen.

According to the sequence of the aforementioned manufacturing steps, the MOS capacitor 540, the P-channel TFT 541 and the N-channel TFT 542 are formed. In the manufacturing steps, by appropriately controlling the conditions of etch back or the thickness of the insulating film 530, and controlling the size of the sidewalls, TFTs each of which channel is 0.2 to 2 μm long can be formed Further subsequently, a passivation film for protecting the MOS capacitor 540, the P-channel TFT 541 and the N-channel TFT 542 may be formed. The passivation film is desirably formed by using silicon nitride, silicon nitride oxide, aluminum nitride, aluminum oxide, silicon oxide and the like that can prevent alkaline metals or alkaline earth metals from being diffused into the MOS capacitor 540, the P-channel TFT 541 and the N-channel TFT 542. Specifically, a silicon oxynitride film having a thickness of about 600 nm may be used as a passivation film for example. In this case, the hydrogenation step may be performed after the formation of the silicon oxynitride film. In this manner, insulating films having three layers of silicon oxynitride, silicon nitride and silicon oxynitride are formed over the MOS capacitor 540, the P-channel TFT 541 and the N-channel TFT 542. Note that the structure and materials thereof are not limited to these. By using the aforementioned structure, the MOS capacitor 540, the P-channel TFT 541 and the N-channel TFT 542 are covered with the base film 502 and the passivation film, therefore, it can be prevented that alkaline metals such as Na or alkaline earth metals are diffused into the semiconductor film used in semiconductor elements, which would otherwise affect the characteristics of the semiconductor elements adversely.

Figure 8D:
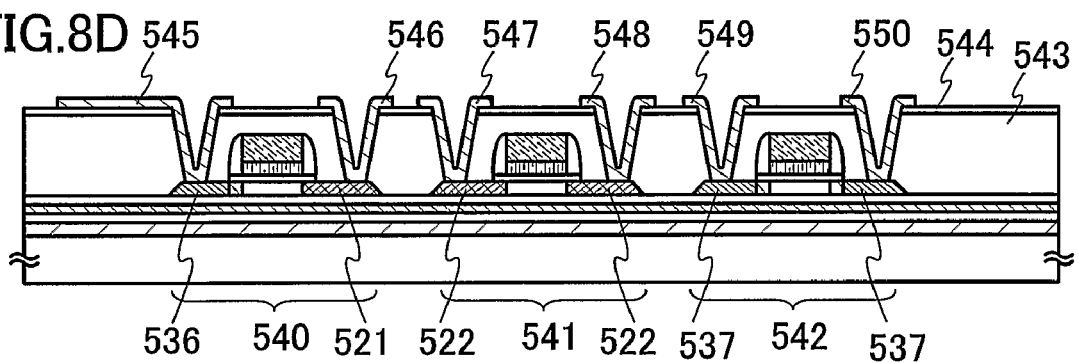

Then, as shown in FIG. 8D, a first interlayer insulating film 543 is formed covering the MOS capacitor 540, the P-channel TFT 541 and the N-channel TFT 542. The first interlayer insulating film 543 may be formed by using a heat-resistant organic resin such as polyimide, acrylic and polyamide. Alternatively, a low-dielectric constant material (low-k material), a siloxane-based resin and the like may be used as well as the organic resin. The first interlayer insulating film 543 may be formed by, according to the materials used therefor, spin coating, dipping, spray coating, droplet discharge method (e.g., ink-jetting, screen printing and offset printing), doctor knife coating, roll coating, curtain coating, knife coating and the like. It may also be formed by using an inorganic material such as silicon oxide, silicon nitride, silicon oxynitride, PSG (Phosphor Silicate Glass), BPSG (Phosphor Silicate Glass) and an alumina film. Note that the first interlayer insulating film 543 may be formed by stacking such insulating films as well.

Further, in this embodiment, a second interlayer insulating film 544 is formed over the first interlayer insulating film 543. The second interlayer insulating film 544 may be formed by using a film containing carbon such as DLC (diamond-like carbon) and carbon nitride (CN), a silicon oxide film, a silicon nitride film, a silicon nitride oxide film and the like. As a manufacturing method, plasma CVD, atmospheric pressure plasma CVD and the like may be used. Alternatively, a photosensitive or non-photosensitive organic material such as polyimide, acrylic, polyamide, resist and benzocyclobutene, a siloxane-based resin and the like may be used.

Note that the first interlayer insulating film 543 or the second interlayer insulating film 544 may be mixed with a filler in order to prevent that the first interlayer insulating film 543 or the second interlayer insulating film 544 peels off or cracks due to a stress generated by a difference in thermal expansion coefficient between the first interlayer insulating film 543 or the second-interlayer insulating film 544 and a conductive material or the like for forming a wiring that is formed later.

Then, contact holes are formed in the first interlayer insulating film 543 and the second interlayer insulating film 544, and wirings 545 to 550 for connecting to the MOS capacitor 540, the P-channel TFT 541 and the N-channel TFT 542 are formed. The contact holes are opened by etching using a mixed gas of $CHF_3$ and He, however, the etching gas is not limited to this. In this embodiment, the wirings 545 to 550 are formed by using Al. Note that the wirings 545 to 550 may be formed by sputtering to have a five-layer structure of Ti, TiN, Al—Si, Ti and TiN.

Note also that by mixing Si into Al, hillock generation can be prevented at resist baking when patterning the wirings. Alternatively, Cu of about 0.5% may be mixed in place of Si. Further, by interposing the Al—Si layer by Ti and TiN, hillock resistance can be further improved. Note that patterning is desirably carried out by use of the aforementioned hard mask formed of silicon oxynitride or the like. Note also that materials and manufacturing method of the wirings are not limited to these, and the materials used for the aforementioned gate electrodes may be adopted as well.

Note that the wiring 545 is connected to the high concentration impurity region 536 of the MOS capacitor 540, and the wiring 546 is connected to the high concentration impurity region 521 of the MOS capacitor 540. The wirings 547 and 548 are connected to the high concentration impurity regions 522 of the P-channel TFT 541 respectively. The wirings 549 and 550 are connected to the high concentration impurity regions 537 of the N-channel TFT 542 respectively.

Figure 8E:
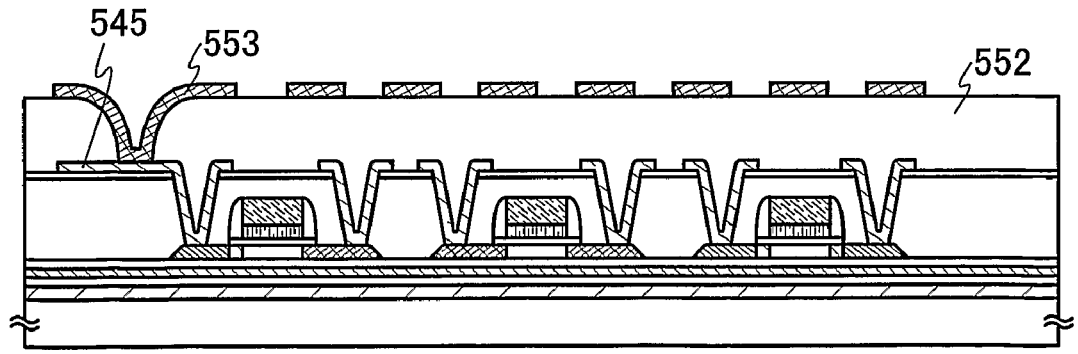

Next, as shown in FIG. 8E, a third interlayer insulating film 552 is formed over the second interlayer insulating film 544 so as to cover the wirings 545 to 550. The third interlayer insulating film 552 has an opening to expose a portion of the wiring 545. In addition, the third interlayer insulating film 552 may be formed by using an organic resin film, an inorganic insulating film or a siloxane-based insulating film. The organic resin film includes, for example, acrylic, polyimide, polyamide and the like while the inorganic insulating film includes silicon oxide, silicon nitride oxide and the like. Note that a mask for forming an opening by photolithography may be formed by a droplet discharge method or a printing method. Alternatively, the third interlayer insulating film 552 per se can be formed by the droplet discharge method or the printing method.

Then, an antenna 553 is formed on the third interlayer insulating film 522. The antenna 553 may be formed by using a conductive material containing one or more metals selected from Ag, Au, Cu, Pd, Cr, Mo, Ti, Ta, W, Al, Fe, Co, Zn, Sn and Ni, or metal compounds thereof. The antenna 553 is connected to the wiring 545. In FIG. 8E, the antenna 553 is directly connected to the wiring 545, however, the ID chip of the present invention is not limited to such a structure. For example, the antenna 553 may be electrically connected to the wiring 545 by using another wiring that is separately formed.

The antenna 553 may be formed by a printing method, photolithography, plating, vapor deposition, a droplet discharge method and the like. In this embodiment, the antenna 553 is formed of a single-layer conductive film, however, the antenna 553 may be formed to have a multi-layer structure where a plurality of conductive films are stacked.

When using a printing method or a droplet discharge method, the antenna 553 can be formed without using an exposure mask. Also, when using a droplet discharge method or a printing method, wasteful materials that would be removed by etching are not produced unlike photolithography. In addition, since an expensive exposure mask is not required, manufacturing cost of an ID chip can be reduced.

When using a droplet discharge method or other printing methods, conductive particles, for example, such as Cu coated with Ag may be used. Note that when forming the antenna 553 by a droplet discharge method, it is desirable that the surface of the third interlayer insulating film 552 be subjected to a processing for increasing adhesion of the antenna 553.

As a specific processing for increasing adhesion, for example, there are a method in which a metal or a metal compound capable of increasing adhesion of a conductive film or an insulating film is attached to the surface of the third interlayer insulating film 552 by catalysis; a method in which an organic insulating film, a metal or a metal compound that is highly adhesive to a conductive film or an insulating film is attached to the surface of the third interlayer insulating film 552; and a method in which the surface of the third interlayer insulating film 552 is applied with plasma treatment in an atmospheric pressure or a low pressure in order to modify the surface. As the metal that is highly adhesive to a conductive film or an insulating film, there are titanium, titanium oxide, and a third transition element such as Sc, Ti, V, Cr, Mn, Fe, Co, Ni, Cu and Zn. As the metal compound that is highly adhesive to a conductive film or an insulating film, there are the aforementioned metal oxide, nitride, oxynitride and the like. As the organic insulating film, for example, there are polyimide, a siloxane-based resin and the like.

When the metal or the metal compound attached to the third interlayer insulating film 552 is conductive, sheet resistance thereof is controlled so as that the normal operation of the antenna 553 is not disturbed. Specifically, the average thickness of the metal or the metal compound having conductivity is controlled to be 1 to 10 nm for example, or the metal or the metal compound is partially or completely insulated by oxidation. Alternatively, regions other than those for increasing adhesion may be selectively removed of its attached metal or metal compound by etching. Further, not by attaching a metal or a metal compound to the entire surface of the substrate in advance, but by using a droplet discharge method, a printing method, a sol-gel process and the like, only a specific region may be selectively attached with the metal or the metal compound. Note that the metal or the metal compound is not required to be in a form of a continuous film over the surface of the third interlayer insulating film 552, and it may be dispersed to a certain degree.

Figure 9A:
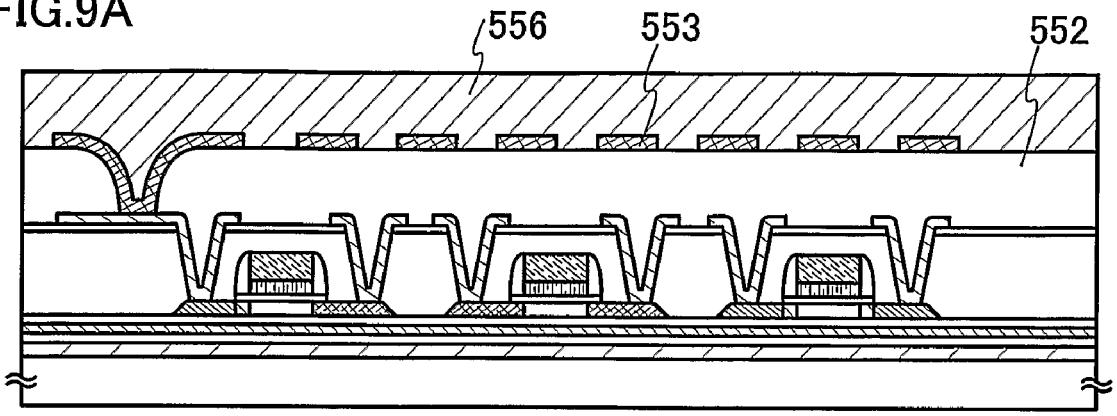
FIGS. 9A to 9C are diagrams illustrating a manufacturing method of the semiconductor device of the present invention.

Next, as shown in FIG. 9A, a protective layer 556 is formed over the third interlayer insulating film 552 so as to cover the antenna 553. The protective layer 556 is formed by using a material capable of protecting the MOS capacitor 540, the P-channel TFT 541, the N-channel TFT 542 and the wirings 545 to 550 in removing the peeling layer 501 by etching later. For example, the protective layer 556 may be formed by coating the entire surface with an epoxy, acrylic or silicone-based resin that is soluble in water or alcohols.

In this embodiment, a water-soluble resin (VL-WSHL10, product of Toagosei Co., Ltd.) is coated to have a thickness of 30 μm by spin coating, followed by exposure for 2 minutes to cure tentatively, and further followed by exposure of UV irradiation for a total of 10 minutes (2.5 minutes for rear surface and 10 minutes for a front surface) to cure completely, thereby forming the protective layer 556. Note that when stacking a plurality of organic resin layers, it is concerned that they might be partially melted by a solvent used for each organic resin at the time of coating or baking, or adhesion thereof might become extremely high. Thus, when the third interlayer insulating film 552 and the protective layer 556 are formed of the same solvent-soluble organic resins, it is preferable to form an inorganic insulating film (e.g., a silicon nitride film, a silicon nitride oxide film, an $AlN_x$ film and an $AlN_xO_Y$ film) covering the third interlayer insulating film 552 so that the protective layer 556 can be removed smoothly in the subsequent step.

Figure 9B:
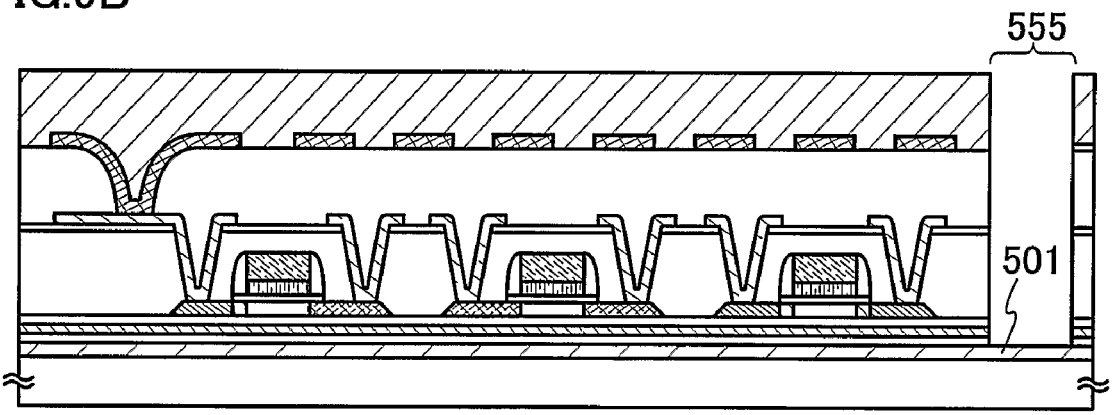

Next, as shown in FIG. 9B, a trench 555 is formed to isolate ID chips. The trench 555 is required to be deep enough to expose the peeling layer 501. The trench 555 is formed by dicing, scribing, photolithography and the like. Note that when there is no need to isolate ID chips formed over the first substrate 500, the trench 555 is not necessarily formed.

Figure 9C:
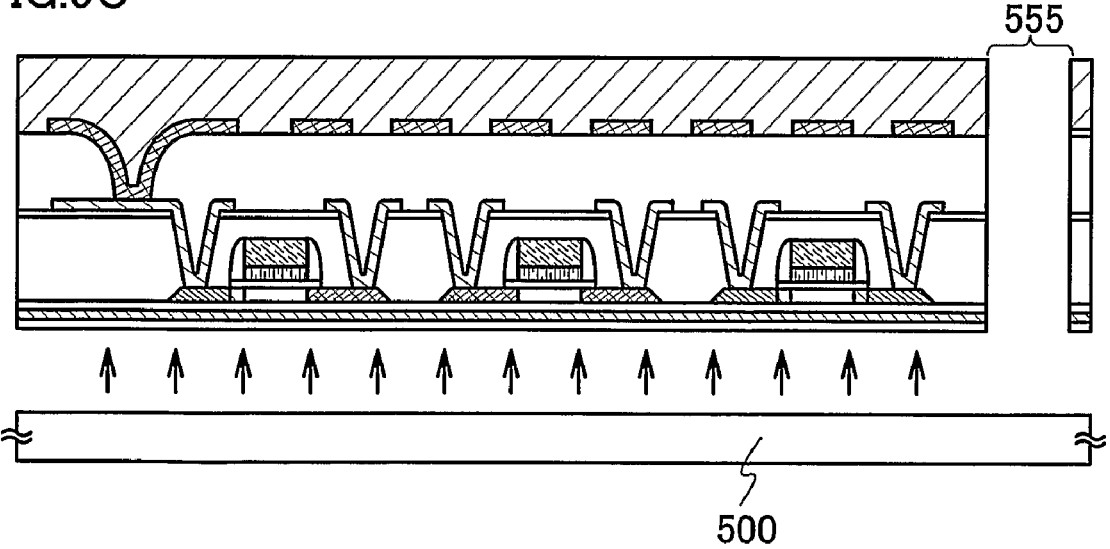

Next, as shown in FIG. 9C, the peeling layer 501 is removed by etching. In this embodiment, fluorine halide is used as an etching gas, which is injected into the trench 555. In this embodiment, etching is performed by use of a $ClF_3$ (chlorine trifluoride) gas under the conditions of the temperature: 350° C., flow rate: 300 sccm, atmospheric pressure: 799.8 Pa (6 Torr) and period: 3 hours. Alternatively, the $ClF_3$ gas may be mixed with nitrogen. By using fluorine halide such as $ClF_3$, the peeling layer 501 is selectively etched, whereby the first substrate 500 can be peeled off the MOS capacitor 540, the P-channel TFT 541 and the N-channel TFT 542. Note that the fluorine halide may be either a gas or a liquid.

Figure 10A:
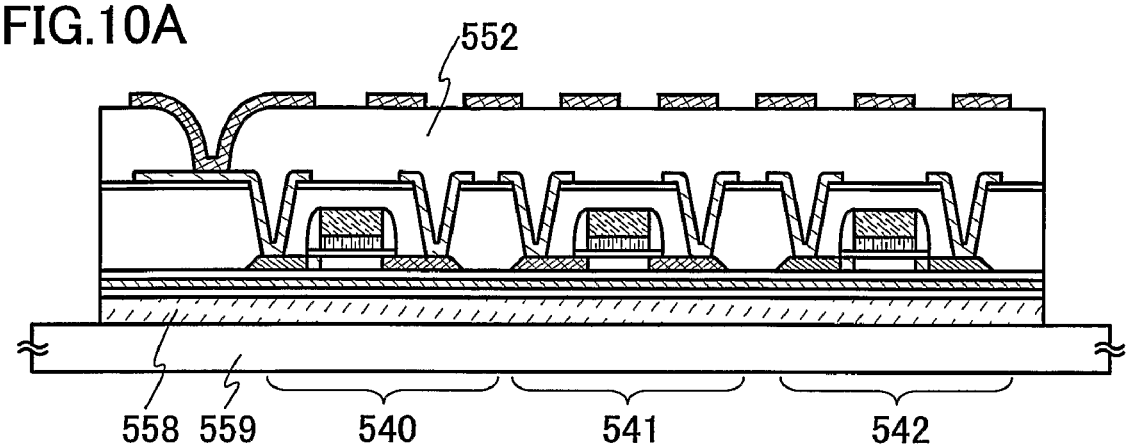
FIGS. 10A and 10B are diagrams illustrating a manufacturing method of the semiconductor device of the present invention.

Next, as shown in FIG. 10A, the peeled MOS capacitor 540, P-channel TFT 541 and N-channel TFT 542 are stuck to the second substrate 559 using an adhesive 558, and the protective layer 556 is removed. The adhesive 558 is formed by using a material capable of sticking the second substrate 559 and the base film 502 to each other. The adhesive 558 may be various types of curing adhesive, for example, such as a photo-curing adhesive (e.g., a reactive curing adhesive, a heat curing adhesive and a UV curing adhesive) and an anaerobic curing adhesive.

The second substrate 559 may be a glass substrate, for example, such as barium borosilicate glass and alumino borosilicate glass, or may be formed by using an organic material such as flexible paper and plastic. Alternatively, the second substrate 559 may be formed by using a flexible inorganic material. The plastic substrate may be ARTON (product of JSR) formed of polynorbornene having a polar group. Alternatively, it may be polyester typified by polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin and the like. The second substrate 559 desirably has high thermal conductivity of around 2 to 30 W/mK in order to diffuse heat generated in the integrated circuit.

Figure 10B:
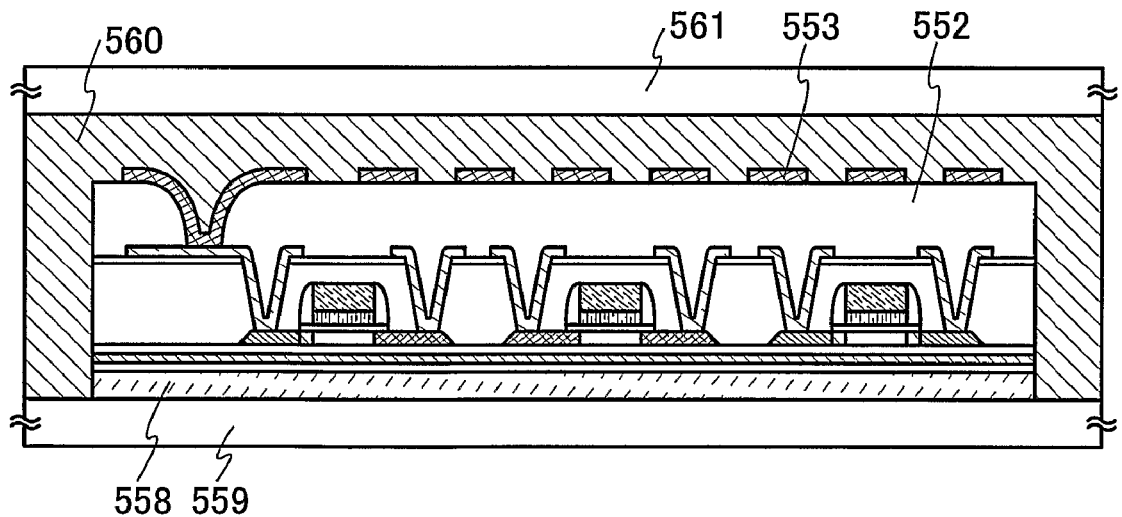
Figure 11:
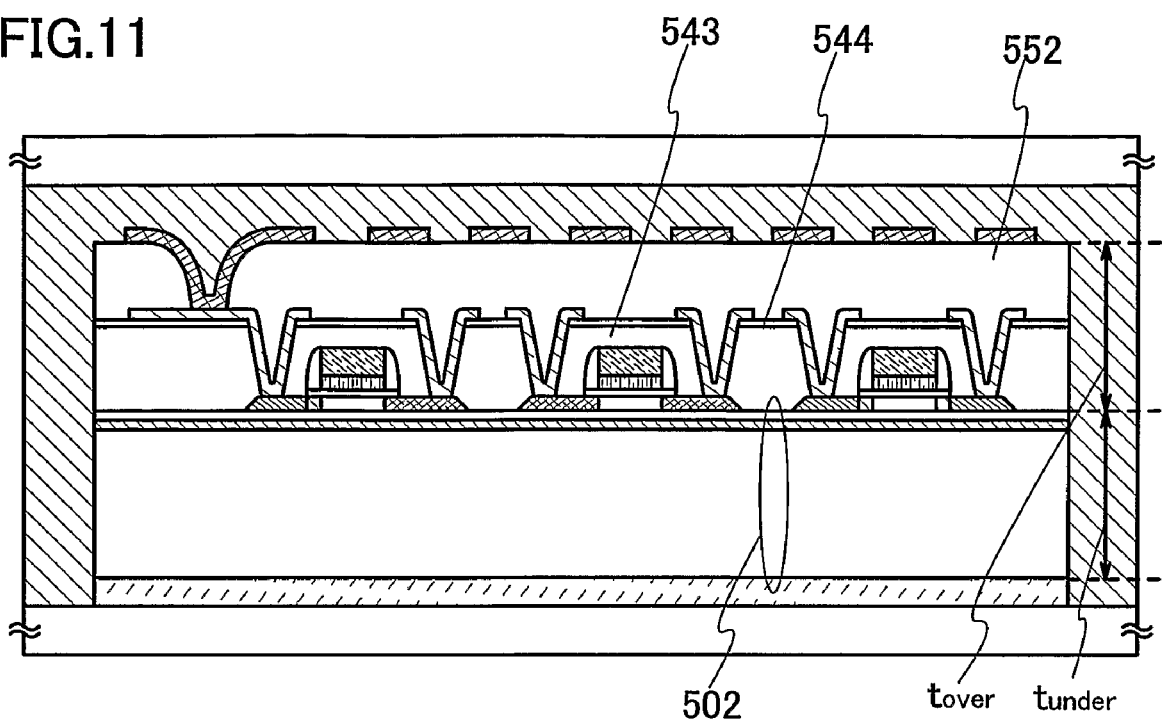
FIG. 11 is a diagram illustrating a manufacturing method of the semiconductor device of the present invention.

Next, as shown in FIG. 10B, the antenna 553 and the third interlayer insulating film 552 are coated with an adhesive 560, and a covering material 561 is stuck thereto. The covering material 561 may be formed by using a similar material to that of the second substrate 559. The adhesive 560 may be 10 to 200 μm thick, for example.

The adhesive 560 is formed by using a material capable of sticking the covering material 561 to the antenna 553 and the third interlayer insulating film 552. The adhesive 560 may be various types of curing adhesive, for example, such as a photo-curing adhesive (e.g., a reactive curing adhesive, a heat curing adhesive and a UV curing adhesive) and an anaerobic curing adhesive.

Note that in this embodiment, the covering material 561 is stuck to the antenna 553 and the third interlayer insulating film 552 using the adhesive 560, however, the present invention is not limited to such a structure, and the covering material 561 is not necessarily provided in the ID chip. For example, mechanical strength of the ID chip may be increased by covering the antenna 553 and the third interlayer insulating film 552 with a resin and the like. Alternatively, the manufacturing steps may be completed as of FIG. 10A without using the covering material 561.

The ID chip is completed through each of the aforementioned steps. According to the manufacturing method, a quite thin integrated circuit having a total thickness of 0.3 to 3 μm, typically around 2 μm can be formed between the second substrate 559 and the covering material 561. Note that the thickness of the integrated circuit includes not only the thickness of the semiconductor elements per se, but also the thickness of the various insulating films and interlayer insulating films formed between the adhesive 558 and the adhesive 560, and it does not include the thickness of the antenna. In addition, the area occupied by the integrated circuit of the ID chip can be reduced to 5 mm square (25 mm²) or less, and desirably around 0.3 mm square (0.09 mm²) to 4 mm square (16 mm²).

Note that by disposing the integrated circuit in as close position as possible to the center between the second substrate 559 and the covering material 561, mechanical strength of the ID chip can be increased. Specifically, assuming that a distance between the second substrate 559 and the covering material 561 is d, the thickness of the adhesive 558 and the adhesive 560 is desirably controlled so that a distance x between the second substrate 559 and the center of the integrated circuit in the thickness direction satisfies the following Formula 1.

$$\tfrac{1}{2}d-30\ \mu m<x<\tfrac{1}{2}d+30\ \mu m \quad \text{[Formula 1]}$$

Alternatively, the thickness of the adhesive 558 and the adhesive 560 is desirably controlled so as to satisfy the following Formula 2.

$$\tfrac{1}{2}d-30\ \mu m<x<\tfrac{1}{2}d+10\ \mu m \quad \text{[Formula 2]}$$

Further alternatively, the thickness of the base film 502, the first interlayer insulating film 543 and the second interlayer insulating film 544 or the third interlayer insulating film 552 may be controlled so that a distance ($t_{under}$) between an island-like semiconductor film of a TFT in an integrated circuit and the bottom portion of the base film 502 is equal to or substantially equal to a distance ($t_{over}$) between the island-like semiconductor film and the top portion of the third interlayer insulating film 552. In this manner, by disposing the island-like semiconductor film in the center of the integrated circuit, stress applied to the semiconductor layer can be alleviated, thereby crack generation can be prevented.

In addition, when using an organic resin for the adhesive 558 that is in contact with the base film 502 so as to secure flexibility of the ID chip, it can be prevented that alkaline metals such as Na or alkaline earth metals are diffused from the organic resin into the semiconductor film by using a silicon nitride film or a silicon nitride oxide film for the base film 502.

Further, when the second substrate 559 is stuck to an object having a curved surface, and the second substrate 559 is curved along a generating line of a conical surface, a cylindrical surface and the like, it is desirable that the direction of the generating line be aligned with the carrier moving direction of the MOS capacitor 540, the P-channel TFT 541 and the N-channel TFT 542. According to such a structure, an adverse effect on the characteristics of the MOS capacitor 540, the P-channel TFT 541 and the N-channel TFT 542 can be prevented even when the second substrate 559 is bent. Further, by setting the area of the island-like semiconductor film that occupies the integrated circuit to be 1 to 30%, an adverse effect on the characteristics of the MOS capacitor 540, the P-channel TFT 541 and the N-channel TFT 542 can be prevented even when the second substrate 559 is bent.

Generally, frequency of radio waves used for an ID chip is 13.56 MHz or 2.45 GHz, and formation of an ID chip capable of detecting such frequency is vital so as to be used for multi-purposes.

The ID chip of the present invention has the advantage that radio waves are less easily intercepted than the ID chip formed by using a semiconductor substrate, thus signal fade due to radio wave interception can be prevented. Thus, since a semiconductor substrate is not required, significant cost reduction of the ID chip can be achieved. For example, a comparison is made now between a semiconductor substrate having a diameter of 12 inches and a glass substrate having a size of 730×920 mm². The former semiconductor substrate has an area of about 73000 mm², and the latter glass substrate has an area of about 672000 mm², which is about 9.2 times as large as the glass substrate. In the case of the latter glass substrate having an area of about 672000 mm², about 672000 ID chips each having an area of 1 mm square can be obtained when disregarding the area consumed by segmentation of the substrate, in which case the number of the ID chips is about 9.2 times as large as the semiconductor substrate. In the case of using such a glass substrate of 730×920 mm², a smaller number of manufacturing steps is required than the case of using the semiconductor substrate having a diameter of 12 inches, thus equipment investment for mass-production of ID chips can be reduced down to one third. Further, according to the present invention, a glass substrate can be reutilized after peeling the integrated circuit. Accordingly, significant cost reduction can be achieved than the case of using a semiconductor substrate even when taking into consideration the cost required for replacing a broken glass substrate or washing the surface of the glass substrate. Further, even when discarding a glass substrate without reutilizing it, the glass substrate of 730×920 mm² costs as half as much as the semiconductor substrate having a diameter of 12 inches, therefore, the cost of the ID chip can be significantly reduced.

Thus, when using the glass substrate of 730×920 mm², the cost of the ID chip can be reduced down to one thirtieth of the case of using the semiconductor substrate having a diameter of 12 inches. ID chips are expected to be used for disposable applications. Therefore, the ID chip of the present invention enabling significant cost reduction is quite effective.

This embodiment can be implemented in combination with Embodiment 1 or 2.

Embodiment 4

Figure 12A:
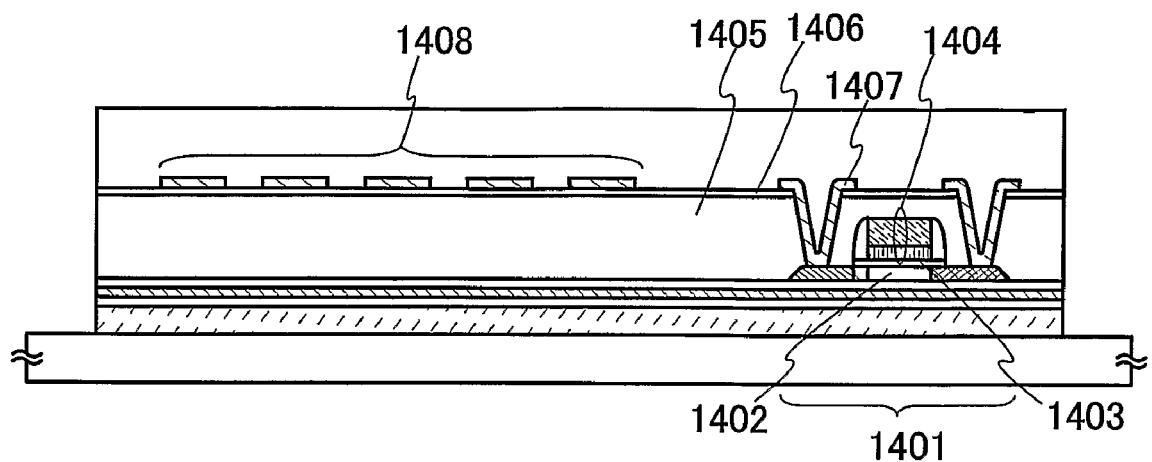
FIGS. 12A and 12B are cross-sectional views of the semiconductor device of the present invention.

Description is made below with reference to FIG. 12A on the structure of a semiconductor device in the case of simultaneously forming an antenna and a wiring connected to a MOS capacitor by patterning a conductive film. FIG. 12A is a cross-sectional view illustrating a semiconductor device of this embodiment.

In FIG. 12A, a MOS capacitor 1401 comprises an island-like semiconductor film 1402, a gate insulating film 1403 that is in contact with the island-like semiconductor film 1402, and a gate electrode 1404 overlapping the island-like semiconductor film 1402 with the gate insulating film 1403 interposed therebetween.

The MOS capacitor 1401 is covered with a first interlayer insulating film 1405 and a second interlayer insulating film 1406. Note that in this embodiment, the MOS capacitor 1401 is covered with two interlayer insulating films of the first interlayer insulating film 1405 and the second interlayer insulating film 1406, however, this embodiment is not limited to such a structure. The MOS capacitor 1401 may be covered with a single-layer interlayer insulating film, or a multi-layer interlayer insulating film having three layers or more.

A wiring 1407 formed on the second interlayer insulating film 1406 is connected to the island-like semiconductor film 1402 through a contact hole formed in the first interlayer insulating film 1405 and the second interlayer insulating film 1406.

In addition, an antenna 1408 is formed on the second interlayer insulating film 1406. The wiring 1407 and the antenna 1408 can be formed simultaneously by forming a conductive film over the second interlayer insulating film 1406 and patterning it. By simultaneously forming the antenna 1408 and the wiring 1407, the number of the manufacturing steps of the semiconductor device can be suppressed.

Figure 12B:
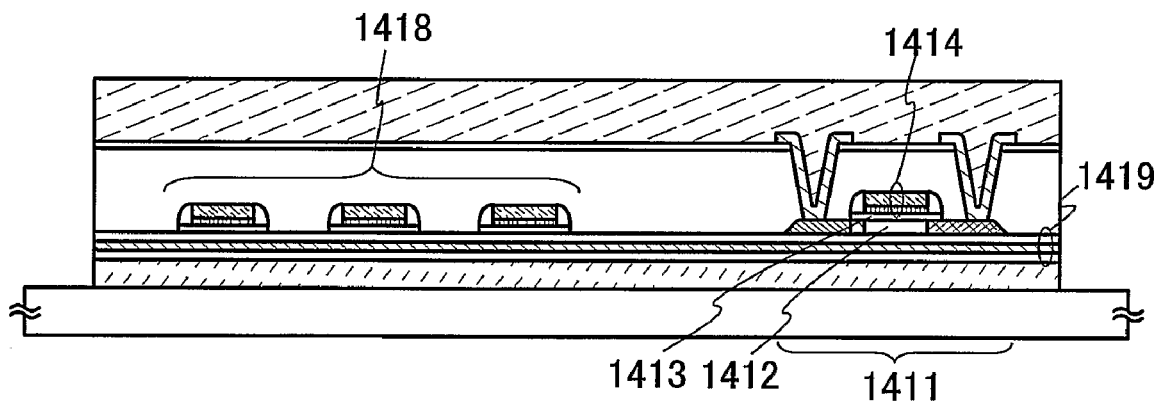

Description is made below with reference to FIG. 12B on the structure of a semiconductor device in the case of simultaneously forming an antenna and a gate electrode of a MOS capacitor by patterning a conductive film. FIG. 12B is a cross-sectional view illustrating a semiconductor device of this embodiment.

In FIG. 12B, a MOS capacitor 1411 comprises an island-like semiconductor film 1412, a gate insulating film 1413 that is in contact with the island-like semiconductor film 1412, and a gate electrode 1414 overlapping the island-like semiconductor film 1412 with the gate insulting film 1413 interposed therebetween.

On a base film 1419, an antenna 1418 is formed. The gate electrode 1414 and the antenna 1418 can be formed simultaneously by forming a conductive film over the gate insulating film 1413 and patterning it. By simultaneously forming the antenna 1418 and the gate electrode 1414, the number of the manufacturing steps of the semiconductor device can be suppressed.

Note that this embodiment illustrates an example where an integrated circuit is peeled off and stuck to another substrate, however, the present invention is not limited to such a structure. For example, when using a heat-resistant substrate such as a glass substrate that is resistant to a processing temperature at heat treatment in the manufacturing steps of the integrated circuit, the integrated circuit is not necessarily peeled off.

Embodiment 5

In this embodiment, description is made on the structure of a semiconductor device where an antenna formed on a separate substrate is electrically connected to an integrated circuit.

Figure 13A:
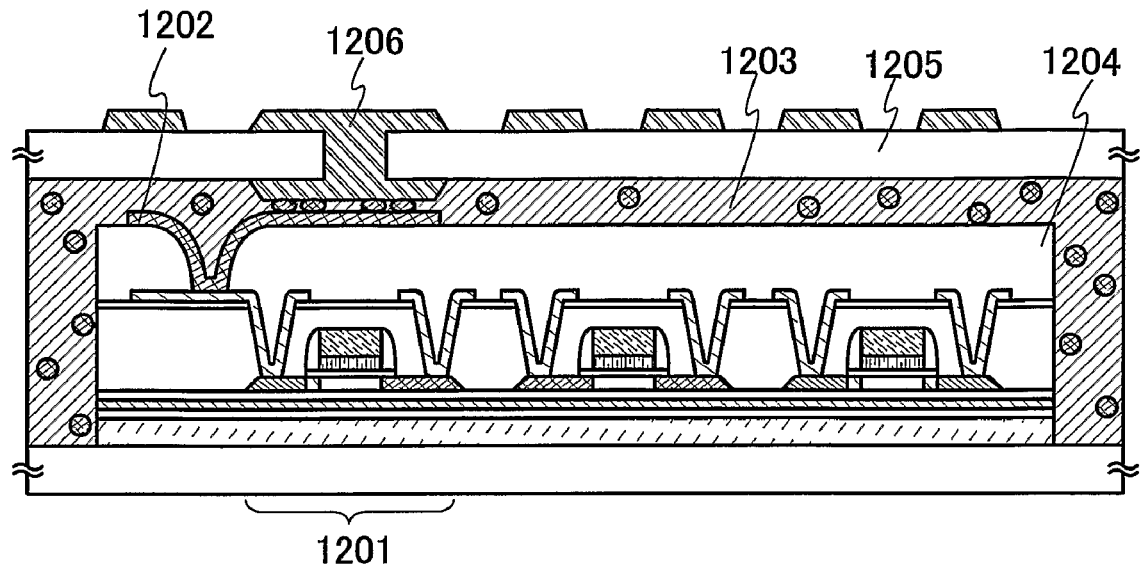
FIGS. 13A and 13B are cross-sectional views of the semiconductor device of the present invention.

FIG. 13A is a cross-sectional view illustrating a semiconductor device of this embodiment. In FIG. 13A, a third interlayer insulating film 1204 is coated with an adhesive 1203 is coated over so as to cover a wiring 1202 electrically connected to a MOS capacitor 1201. Then, a covering material 1205 is stuck to the third interlayer insulating film 1204 with the adhesive 1203.

The covering material 1205 is formed with an antenna 1206 in advance. In this embodiment, the antenna 1206 is electrically connected to the wiring 1202 by using an anisotropic conductive resin as the adhesive 1203.

The anisotropic conductive resin is a resin material dispersed with a conductive material. The resin material may be, for example, a heat curing resin such as epoxy, urethane and acrylic-based resins, a thermoplastic resin such as a polyethylene-based resin and a polypropylene-based resin, a siloxane-based resin, or the like. In addition, the conductive material may be, for example, plastic (e.g., polystyrene and epoxy) particles plated with Ni or Au, metal particles such as Ni, Au, Ag and solder, particulate or fibrous carbon, fibrous Ni plated with Au, or the like. The size of the conductive material is desirably determined in accordance with the pitch of the antenna 1206 and the wiring 1202.

The antenna 1206 may be attached to the wiring 1202 by applying pressure to the anisotropic conductive resin using ultrasonic waves, or by curing with UV irradiation.

Note that this embodiment illustrates an example where the antenna 1206 is electrically connected to the wiring 1202 with the adhesive 1203 using an anisotropic conductive resin, however, the present invention is not limited to such a structure. In place of using the adhesive 1203, the antenna 1206 may be electrically connected to the wiring 1202 using an anisotropic conductive film by applying pressure.

Figure 13B:
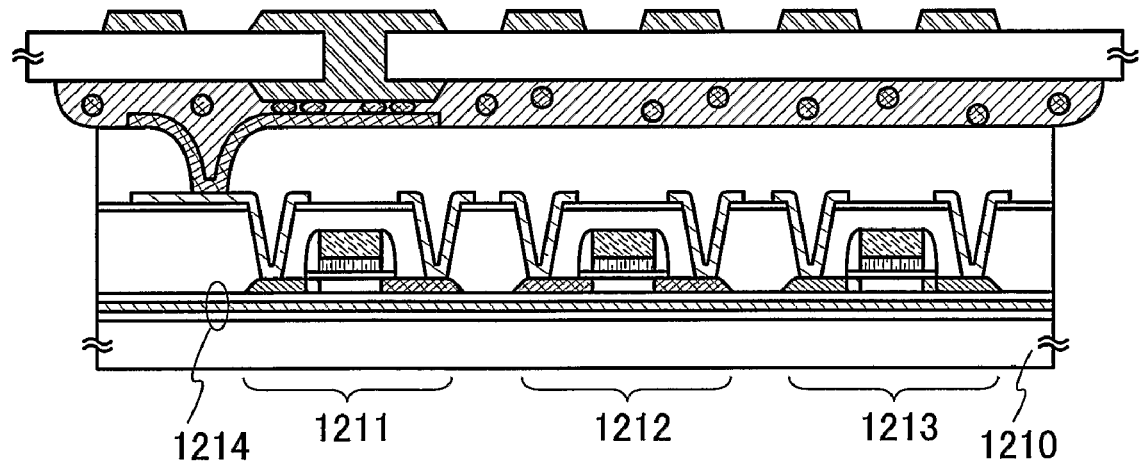

Note that this embodiment illustrates a semiconductor device formed by sticking a peeled integrated circuit to another substrate, however, the present invention is not limited to such a structure. For example, when using a heat-resistant substrate such as a glass substrate that is resistant to a processing temperature at heat treatment in the manufacturing steps of the integrated circuit, the integrated circuit is not necessarily peeled off. FIG. 13B is a cross-sectional view illustrating one mode of a semiconductor device formed by using a glass substrate.

The semiconductor device shown in FIG. 13B uses a glass substrate as the substrate 1210, and a base film 1214 is formed in contact with each of the MOS capacitor 1211, the TFTs 1212 and 1213, and the substrate 1210 without providing an adhesive between them.

Embodiment 6

The MOS capacitor of the present invention is a non-conductive capacitor, therefore, it can be used not only for a circuit to which an AC voltage is applied but also for a circuit to which a DC voltage is applied. In this embodiment, description is made on an example where the MOS capacitor of the present invention is used in a DRAM.

Figure 14A:
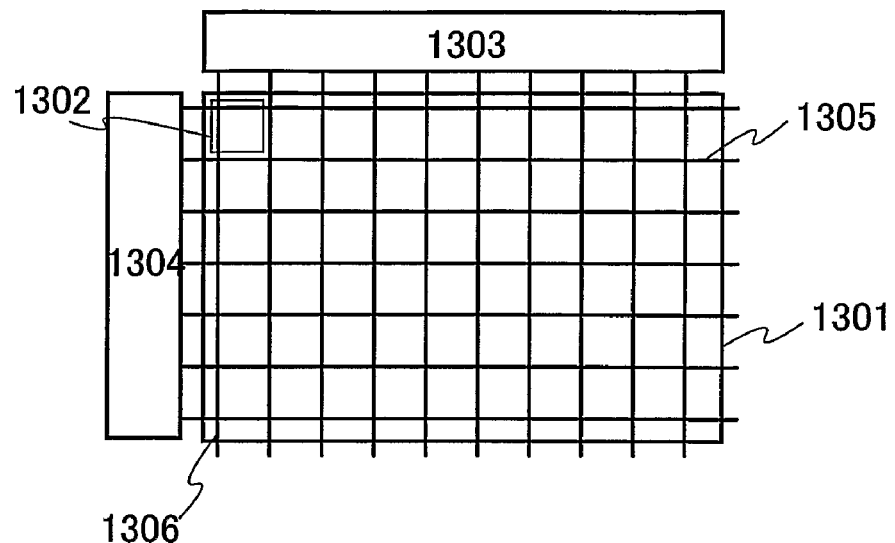
FIGS. 14A to 14C are diagrams each illustrating a configuration of a DRAM using the MOS capacitor of the present invention.

FIG. 14A is a block diagram illustrating an exemplary DRAM. Reference numeral 1301 denotes a cell array, 1303 denotes a column decoder and 1304 denotes a row decoder. The cell array 1301 comprises a plurality of memory cells 1302 arranged in matrix. The cell array 1301 also comprises a bit line 1305 and a word line 1306.

The row decoder 1304 can select the memory cell 1302 by controlling a voltage applied to the bit line 1305. Meanwhile, the column decoder 1303 can control writing/reading of data to/from the selected memory cell 1302 through the word line 1306.

Figure 14B:
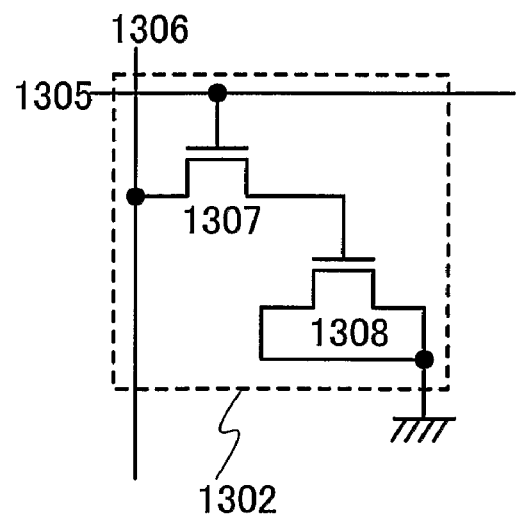

FIG. 14B illustrates a specific exemplary circuit diagram of the memory cell 1302. Reference numeral 1307 denotes a transistor functioning as a switching element, and 1308 denotes the MOS capacitor of the present invention. A gate electrode of the transistor 1307 is connected to the bit line 1305. One of a source region and a drain region of the transistor 1307 is connected to the word line 1306, and the other is connected to a gate electrode of the MOS capacitor 1308. A source region and a drain region of the MOS capacitor 1308 are supplied with a constant voltage such as ground (GND).

Figure 14C:
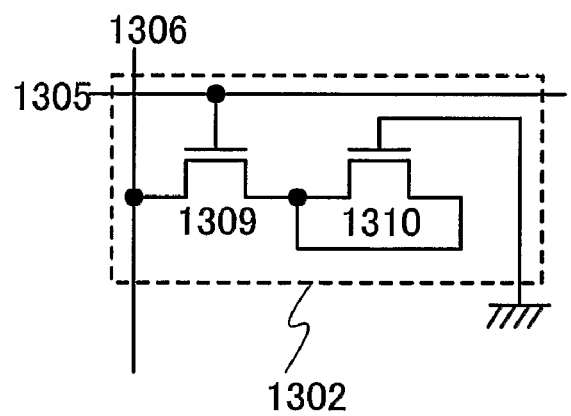

FIG. 14C illustrates another specific exemplary circuit diagram of the memory cell 1302 that is different from FIG. 14B. Reference numeral 1309 denotes a transistor functioning as a switching element, and 1310 denotes the MOS capacitor of the present invention. A gate electrode of the transistor 1309 is connected to the bit line 1305. One of a source region and a drain region of the transistor 1309 is connected to the word line 1306, and the other is connected to a source region and a drain region of the MOS capacitor 1310. A gate electrode of the MOS capacitor 1310 is supplied with a constant voltage such as ground (GND).

Note that the MOS capacitor of the present invention can be used not only for a DRAM but also for other integrated circuits.

This embodiment can be implemented in combination with any one of Embodiments 1 to 5.

Embodiment 7

Description is made below on an exemplary semiconductor device of the present invention where the aforementioned MOS capacitor is used in an integrated circuit or a resonant circuit.

Figure 16A:
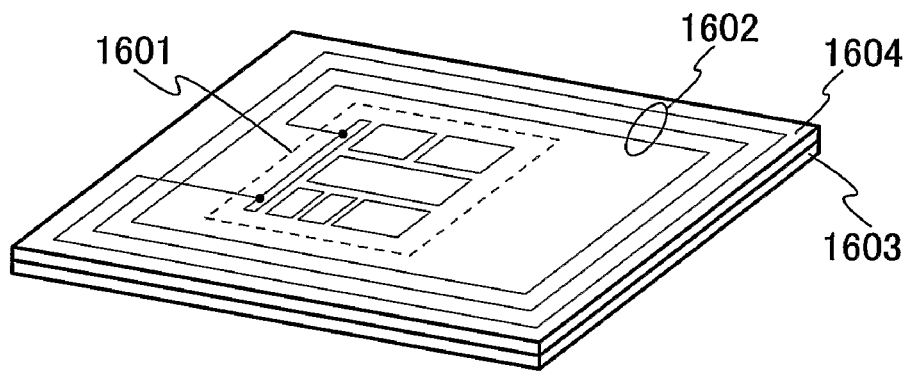
FIGS. 16A and 16B are views each illustrating a semiconductor device using the MOS capacitor of the present invention.

FIG. 16A is a perspective view illustrating one mode of an ID chip as an exemplary semiconductor device of the present invention. Reference numeral 1601 denotes an integrated circuit and 1602 denotes an antenna. The antenna 1602 is connected to the integrated circuit 1601. Reference numeral 1603 denotes a substrate and 1604 denotes a covering material. The integrated circuit 1601 and the antenna 1602 are formed over the substrate 1603, and the covering material 1604 overlaps the substrate 1603 so as to cover the integrated circuit 1601 and the antenna 1602. Note that the covering material 1604 is not necessarily provided. However, by covering the integrated circuit 1601 and the antenna 1602 with the covering material 1604, mechanical strength of the ID chip can be increased. According to the present invention, an ID chip can be completed by manufacturing the integrated circuit 1601 and a resonant circuit having the antenna 1602. Also, according to the present invention, a MOS capacitor having a high capacitance value per area can be formed while suppressing the number of the manufacturing steps, therefore, cost reduction of the ID chip of the present invention can be achieved.

Figure 16B:
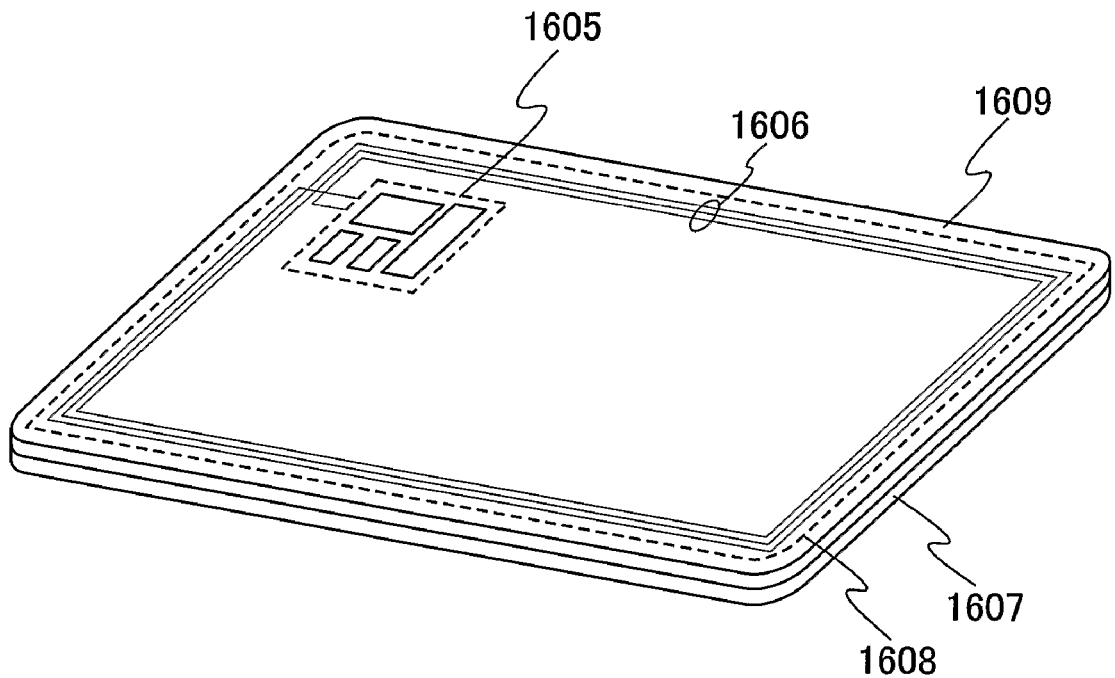

FIG. 16B is a perspective view illustrating one mode of an IC card as an exemplary semiconductor device of the present invention. Reference numeral 1605 denotes an integrated circuit and 1606 denotes an antenna. The antenna 1606 is connected to the integrated circuit 1605. Reference numeral 1608 denotes a substrate functioning as an inlet sheet, and 1607 and 1609 denote covering materials. The integrated circuit 1605 and the antenna 1606 are formed over the substrate 1608, and the substrate 1608 is interposed between the two covering materials 1607 and 1609. Note that the IC card of the present invention may have a display device connected to the integrated circuit 1605. According to the present invention, an IC card can be completed by manufacturing the integrated circuit 1605 and a resonant circuit having the antenna 1606. Also, according to the present invention, a MOS capacitor having a high capacitance value per area can be formed while suppressing the number of the manufacturing steps, therefore, cost reduction of the IC card of the present invention can be achieved.

The present application is based on Japanese Priority application No. 2004-132813 filed on Apr. 28, 2004 with the Japanese Patent Office, the entire contents of which are hereby incorporated by reference.

EXPLANATION OF REFERENCE

101: channel formation region 102: insulating film (gate insulating film) 103: gate electrode 104: N-type region 105: P-type region 106: N channel 107: P channel 201: active layer 202: gate electrode 203: gate insulating film 204: channel formation region 205: N-type region 206: P-type region 207: wiring 209: contact hole 301: active layer 302: gate electrode 303: gate electrode 304: gate electrode 305: gate insulating film 306: channel formation region 307: channel formation region 308: channel formation region 309: N-type region 310: N-type region 311: P-type region 312: P-type region 313: wiring 314: contact hole 401: semiconductor substrate 402: gate electrode 403: gate insulating film 404: N-type region 405: P-type region 500: substrate 501: peeling layer 502: base film 503: semiconductor film 504: semiconductor film 505: semiconductor film 506: semiconductor film 507: gate insulating film 509: gate electrode 510: gate electrode 511: gate electrode 512: mask 514: mask 516: low concentration impurity region 517: low concentration impurity region 520: mask 521: high concentration impurity region 522: high concentration impurity region 530: insulating film 531: sidewall 532: sidewall 533: sidewall 534: mask 536: high concentration impurity region 537: high concentration impurity region 540: MOS capacitor 541: P-channel TFT 542: N-channel TFT 543: interlayer insulating film 544: interlayer insulating film 545: wiring 546: wiring 547: wiring 548: wiring 549: wiring 552: interlayer insulating film 553: antenna 555: trench 556: protective layer 558: adhesive 559: substrate 560: adhesive 561: covering material 601: integrated circuit 602: antenna 603: capacitor 604: rectification circuit 605: clock generation circuit 606: demodulation circuit 607: modulation circuit 608: logic circuit portion 701: pixel portion 702: scan line driver circuit 703: signal line driver circuit 704: pixel 705: TFT 706: liquid crystal cell 707: storage capacitor 708: signal line 709: scan line 710: pixel electrode 711: active layer 712: channel formation region 713: channel formation region 714: N-type region 715: N-type region 716: P-type region 720: gate electrode 721: gate insulating film 722: gate electrode 723: wiring 724: wiring 725: alignment film 726: counter electrode 727: alignment film 728: liquid crystal 1201: MOS capacitor 1202: wiring 1203: adhesive 1204: interlayer insulating film 1205: covering material 1206: antenna 1210: substrate 1211: MOS capacitor 1212: TFT 1213: TFT 1214: base film 1301: cell array 1302: memory cell 1303: column decoder 1304: row decoder 1305: bit line 1306: word line 1307: transistor 1308: MOS capacitor 1309: transistor 1310: MOS capacitor 1401: MOS capacitor 1402: semiconductor film 1403: gate insulating film 1404: gate electrode 1405: interlayer insulating film 1406: interlayer insulating film 1407: wiring 1408: antenna 1411: MOS capacitor: 1412: semiconductor film 1413: gate insulating film 1414: gate electrode 1418: antenna 1419: base film 1601: integrated circuit 1602: antenna 1603: substrate 1604: covering material 1605: integrated circuit 1606: antenna 1607: covering material 1608: substrate

The invention claimed is:

1. A MOS capacitor comprising:
   first and second electrodes;
   an insulating film; and
   a semiconductor film including first and second channel formation regions and first, second, and third impurity regions,
   wherein the first impurity region has N-type conductivity;
   wherein the second and third impurity regions have P-type conductivity;
   wherein the first channel formation region is interposed between the first impurity region and the second impurity region;
   wherein the first channel formation region is in contact with the first impurity region and the second impurity region;
   wherein the first channel formation region overlaps the first electrode with the insulating film interposed therebetween;
   wherein the second channel formation region is interposed between the first impurity region and the third impurity region;

wherein the second channel formation region is in contact with the first impurity region and the third impurity region; and wherein the second channel formation region overlaps the second electrode with the insulating film interposed therebetween.

2. The MOS capacitor according to claim 1, wherein the insulating film is formed over the first and second channel formation regions, and the first and second electrodes are formed over the insulating film.

3. The MOS capacitor according to claim 1, wherein the first impurity region comprises a fourth impurity region and a fifth impurity region, wherein the fourth impurity region is interposed between the first channel formation region and the fifth impurity region, and wherein the fourth impurity region has a lower concentration of impurities than the fifth impurity region.

4. The MOS capacitor according to claim 1, wherein charges are accumulated in the first and second channel formation regions.

5. A MOS capacitor comprising:

first and second electrodes;

an insulating film; and a semiconductor film including first and second channel formation regions and first, second, and third impurity regions, wherein the first and second impurity regions have N-type conductivity;

wherein the third impurity region has P-type conductivity;

wherein the first channel formation region is interposed between the first impurity region and the third impurity region;

wherein the first channel formation region is in contact with the first impurity region and the third impurity region;

wherein the first channel formation region overlaps the first electrode with the insulating film interposed therebetween;

wherein the second channel formation region is interposed between the second impurity region and the third impurity region;

wherein the second channel formation region is in contact with the second impurity region and the third impurity region; and wherein the second channel formation region overlaps the second electrode with the insulating film interposed therebetween.

6. The MOS capacitor according to claim 5, wherein the insulating film is formed over the first and second channel formation regions, and the first and second electrodes are formed over the insulating film.

7. The MOS capacitor according to claim 5, wherein the first impurity region comprises a fourth impurity region and a fifth impurity region, wherein the fourth impurity region is interposed between the first channel formation region and the fifth impurity region, and wherein the fourth impurity region has a lower concentration of impurities than the fifth impurity region.

8. The MOS capacitor according to claim 5, wherein charges are accumulated in the first and second channel formation regions.

9. A semiconductor device according to any one of claims 1 to 8, wherein the semiconductor device comprises at least the MOS capacitor.

10. A semiconductor device according to any one of claims 1 to 8, wherein the semiconductor device comprises:

a plurality of pixels each including a switching element, a liquid crystal cell, and the MOS capacitor for storing a voltage of the liquid crystal cell.

11. A semiconductor device according to any one of claims 1 to 8, wherein the semiconductor device comprises:

an integrated circuit;

an antenna; and the MOS capacitor connected to opposite terminals of the antenna.

* * * * *